(12) United States Patent
Guler et al.

(10) Patent No.: US 12,266,708 B2
(45) Date of Patent: *Apr. 1, 2025

(54) INTEGRATED CIRCUIT STRUCTURES HAVING DIELECTRIC ANCHOR VOID

(71) Applicant: Intel Corporation, Santa Clara, CA (US)

(72) Inventors: Leonard P. Guler, Hillsboro, OR (US); Charles H. Wallace, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/400,797

(22) Filed: Dec. 29, 2023

(65) Prior Publication Data

US 2024/0145568 A1    May 2, 2024

Related U.S. Application Data

(63) Continuation of application No. 17/551,022, filed on Dec. 14, 2021.

(51) Int. Cl.
*H01L 29/423* (2006.01)
*H01L 27/088* (2006.01)
*H01L 29/06* (2006.01)
*H01L 29/786* (2006.01)

(52) U.S. Cl.
CPC ...... *H01L 29/42392* (2013.01); *H01L 27/088* (2013.01); *H01L 29/0673* (2013.01); *H01L 29/78696* (2013.01)

(58) Field of Classification Search
CPC .................................................. H01L 29/4239
See application file for complete search history.

(56) References Cited

U.S. PATENT DOCUMENTS

| 10,090,328 | B2 * | 10/2018 | Yang | H01L 29/66772 |
| 10,832,916 | B1 | 11/2020 | Xie | |
| 2017/0125411 | A1 * | 5/2017 | Yu | H01L 21/823431 |
| 2017/0194213 | A1 * | 7/2017 | Ching | H01L 21/823418 |
| 2019/0061720 | A1 * | 2/2019 | Kunz | B60T 8/409 |

(Continued)

OTHER PUBLICATIONS

Search Report from European Patent Application No. 22213021.3, mailed May 11, 2023, 9 pgs.

*Primary Examiner* — Mounir S Amer
(74) *Attorney, Agent, or Firm* — Schwabe, Williamson & Wyatt, P.C.

(57) ABSTRACT

Integrated circuit structures having a dielectric anchor void, and methods of fabricating integrated circuit structures having a dielectric anchor void, are described. For example, an integrated circuit structure includes a sub-fin in a shallow trench isolation (STI) structure. A plurality of horizontally stacked nanowires is over the sub-fin. A gate dielectric material layer is surrounding the horizontally stacked nanowires. A gate electrode structure is over the gate dielectric material layer. A dielectric anchor is laterally spaced apart from the plurality of horizontally stacked nanowires and recessed into a first portion of the STI structure. A second portion of the STI structure on a side of the plurality of horizontally stacked nanowires opposite the dielectric anchor has a trench therein. A dielectric gate plug is on the dielectric anchor.

25 Claims, 20 Drawing Sheets

(56) References Cited

U.S. PATENT DOCUMENTS

2019/0067120 A1\* 2/2019 Ching ............. H01L 21/823431
2019/0139957 A1\* 5/2019 Liao ................... H01L 27/0924
2021/0057023 A1 2/2021 Liaw
2021/0366908 A1 11/2021 Pan \* cited by examiner

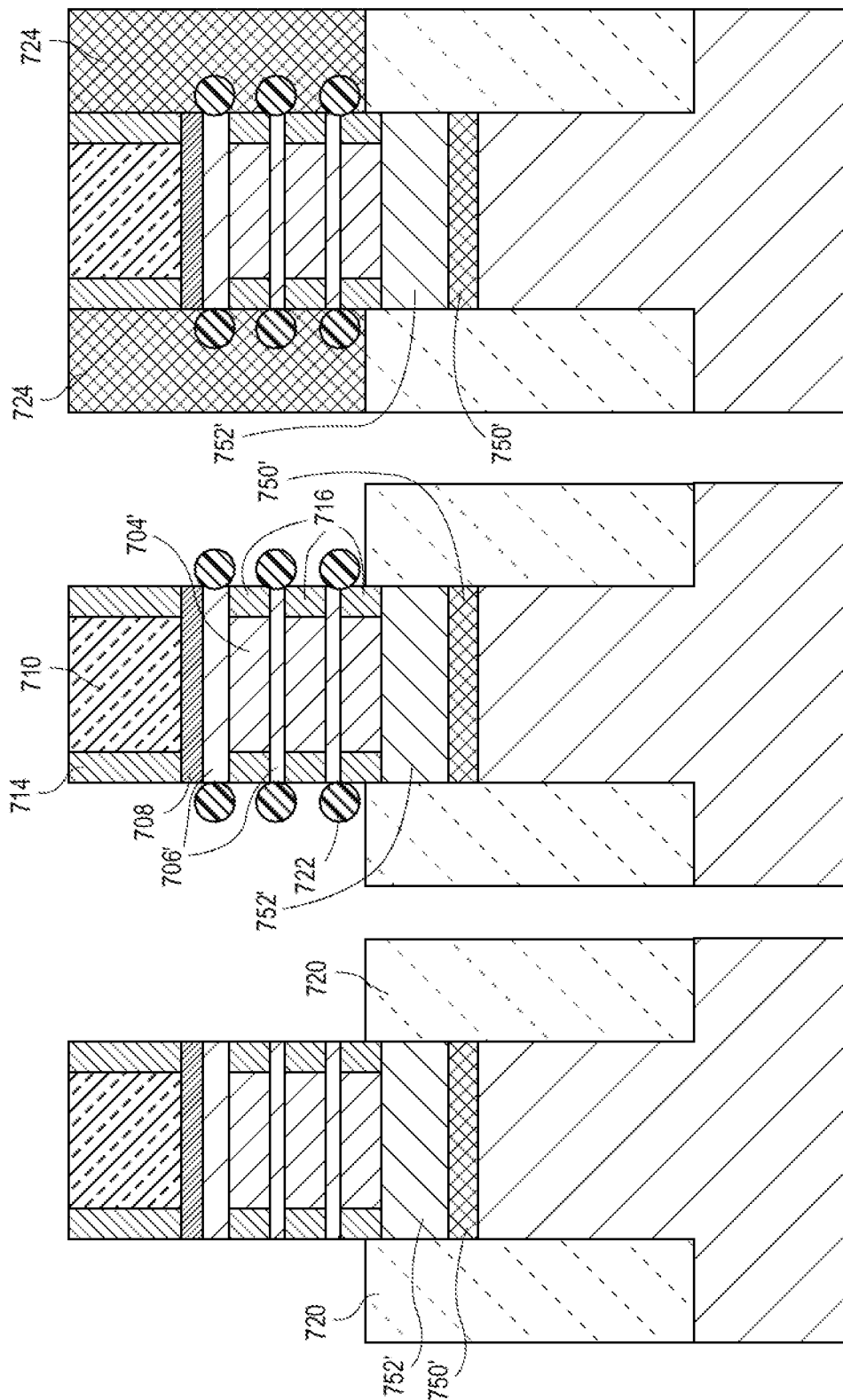

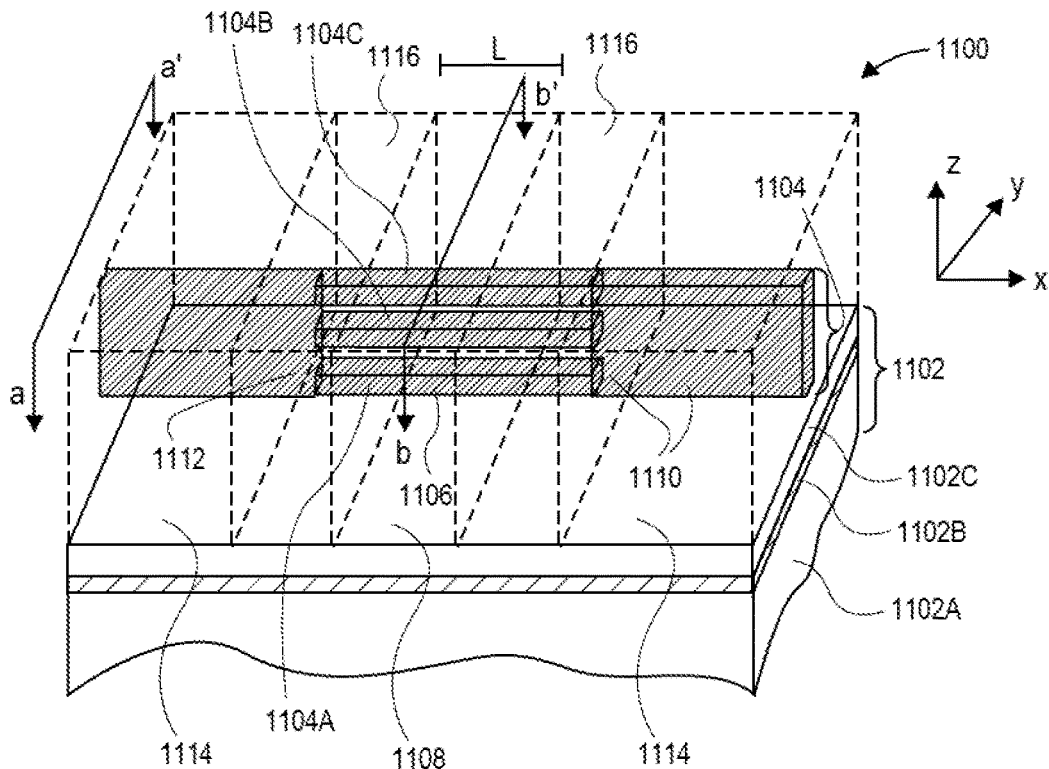
FIG. 11A
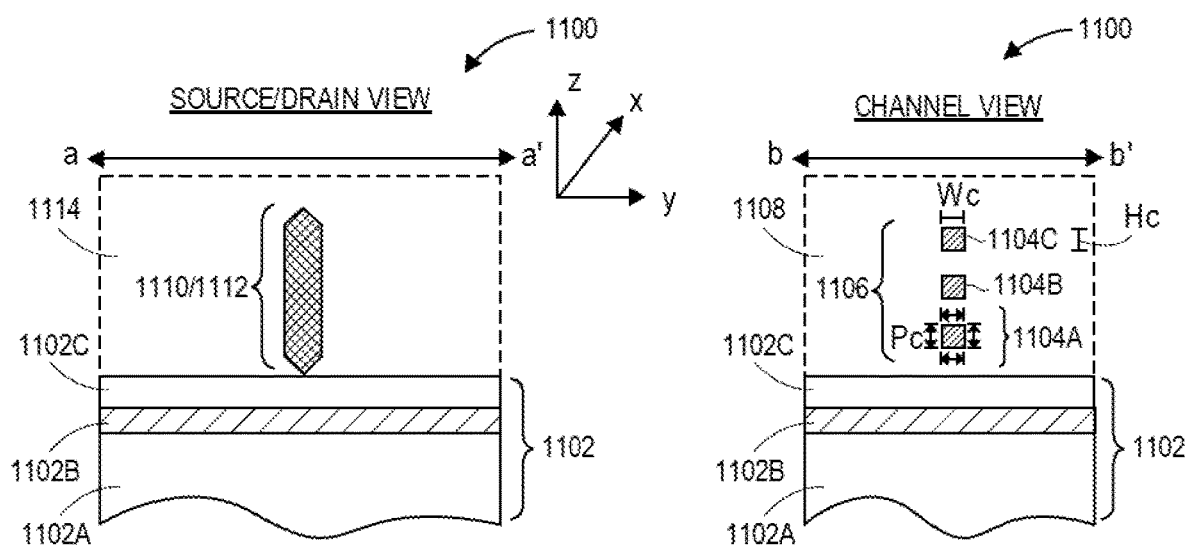
FIG. 11B  FIG. 11C

INTEGRATED CIRCUIT STRUCTURES HAVING DIELECTRIC ANCHOR VOID

CROSS-REFERENCE TO RELATED APPLICATIONS

This application is a continuation of U.S. patent application Ser. No. 17/551,022, filed on Dec. 14, 2021, the entire contents of which is hereby incorporated by reference herein.

TECHNICAL FIELD

Embodiments of the disclosure are in the field of integrated circuit structures and processing and, in particular, integrated circuit structures having a dielectric anchor void, and methods of fabricating integrated circuit structures having a dielectric anchor void.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 7A-7J illustrates cross-sectional views of various operations in a method of fabricating a gate-all-around integrated circuit structure, in accordance with an embodiment of the present disclosure.

FIG. 11A illustrates a three-dimensional cross-sectional view of a nanowire-based integrated circuit structure, in accordance with an embodiment of the present disclosure.

FIG. 11B illustrates a cross-sectional source or drain view of the nanowire-based integrated circuit structure of FIG. 11A, as taken along the a-a' axis, in accordance with an embodiment of the present disclosure.

FIG. 11C illustrates a cross-sectional channel view of the nanowire-based integrated circuit structure of FIG. 11A, as taken along the b-b' axis, in accordance with an embodiment of the present disclosure.

DESCRIPTION OF THE EMBODIMENTS

Figure 1A:
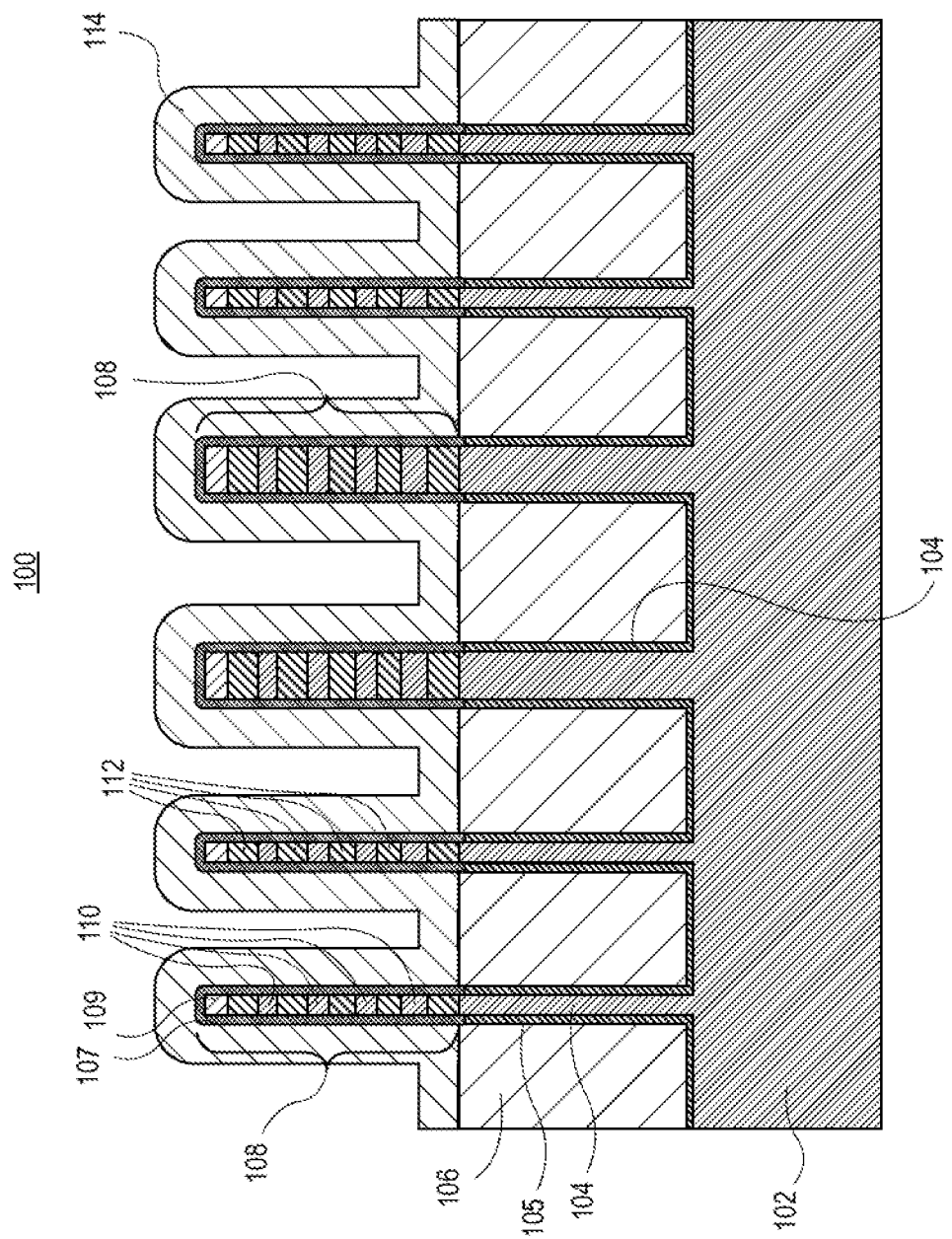
FIGS. 1A-1F illustrate cross-sectional views representing various operations in a method of fabricating an integrated circuit structure using selective dielectric anchor removal, in accordance with an embodiment of the present disclosure.

Integrated circuit structures having a dielectric anchor void, and methods of fabricating integrated circuit structures having a dielectric anchor void, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to the formation of self-aligned anchors to improve gate end to end process margin. One or more embodiments described herein are directed to the selective removal of certain ones of such anchors. One or more embodiments described herein are directed to integrated circuit structures having cut gates with reduced aspect ratio, e.g., relatively shorter, cuts/plugs. One or more embodiments described herein are directed to integrated circuit structures having cut work function metals for gate end-to-end isolation. One or more embodiments described herein are directed to gate all around devices having cut work function metals for gate end-to-end isolation. It is to be appreciated that, unless indicated otherwise, reference to nanowires herein can indicate nanowires or nanoribbons. One or more embodiments described herein are directed to FinFET structures having cut work function metals for gate end-to-end isolation.

To provide context, a high aspect ratio gate plug etch can be difficult with smaller endcap and narrow end-to-end design requirements. State-of-the-art approaches demand improved process capability and control to support advanced technology definition, but this can require etch/tool innovation. A high aspect ratio etch can be fundamentally challenging for an etch chemistry.

In accordance with one or more embodiments of the present disclosure. formation of a self-aligned anchor (wall) in between channels or the end-to-end plug to land on is described. Embodiments described herein may be applicable for (i) end-to-end plug-etch before metal gate deposition and/or (ii) end-to-end plug-etch after metal gate deposition. One or more embodiments can be implemented to relax requirements of end-to-end plug etch process ensuring better process control and higher yield. End of line TEM of fin cut in gate may reveal implementation of a self-aligned wall or anchor under gate-plugs. In one embodiment, the anchor is located only inside a gate. In one embodiment, a gate spacer and contact track does not have an associated anchor.

To provide further context, it may be beneficial to place an anchor only in desired locations. In an embodiment, a hardmask layer is used to block the anchor spacer deposition in select locations.

As an exemplary processing scheme, FIGS. 1A-1F illustrate cross-sectional views representing various operations in a method of fabricating an integrated circuit structure using selective dielectric anchor removal, in accordance with an embodiment of the present disclosure. It is to be appreciated that the embodiments described and illustrated may also be applicable for a fin structure in place of a stack of nanowires.

Referring to FIG. 1A, a fin cut of a starting structure 100 is depicted. The starting structure 100 includes a substrate 102, such as a silicon substrate, having subfins 104 protruding through isolation structures 106, such as silicon oxide or silicon oxide isolation structures. A passivation layer, such as a silicon nitride layer, may be included between the isolation structures 106 and the subfins 104, as is depicted. Fins 108 are formed on corresponding ones of the subfins 104. In one embodiment, each fin 108 includes a plurality of nanowires 110, such as silicon nanowires. Each fin 108 also includes a sacrificial material 112, such as silicon germanium, alternating with the plurality of nanowires 110. In a specific embodiment, each fin 108 further includes a dielectric cap 109, such as a silicon nitride cap, as is depicted. A passivation layer 107, such as a silicon oxide passivation layer, may be included along the top and sides of each fin 108, as is also depicted. Referring again to FIG. 1A, anchor spacer deposition is performed to define endcap features. In a particular embodiment, a sacrificial spacer material 114, such as a silicon oxide or silicon dioxide material, is formed conformal with the fins 108.

Figure 1B:
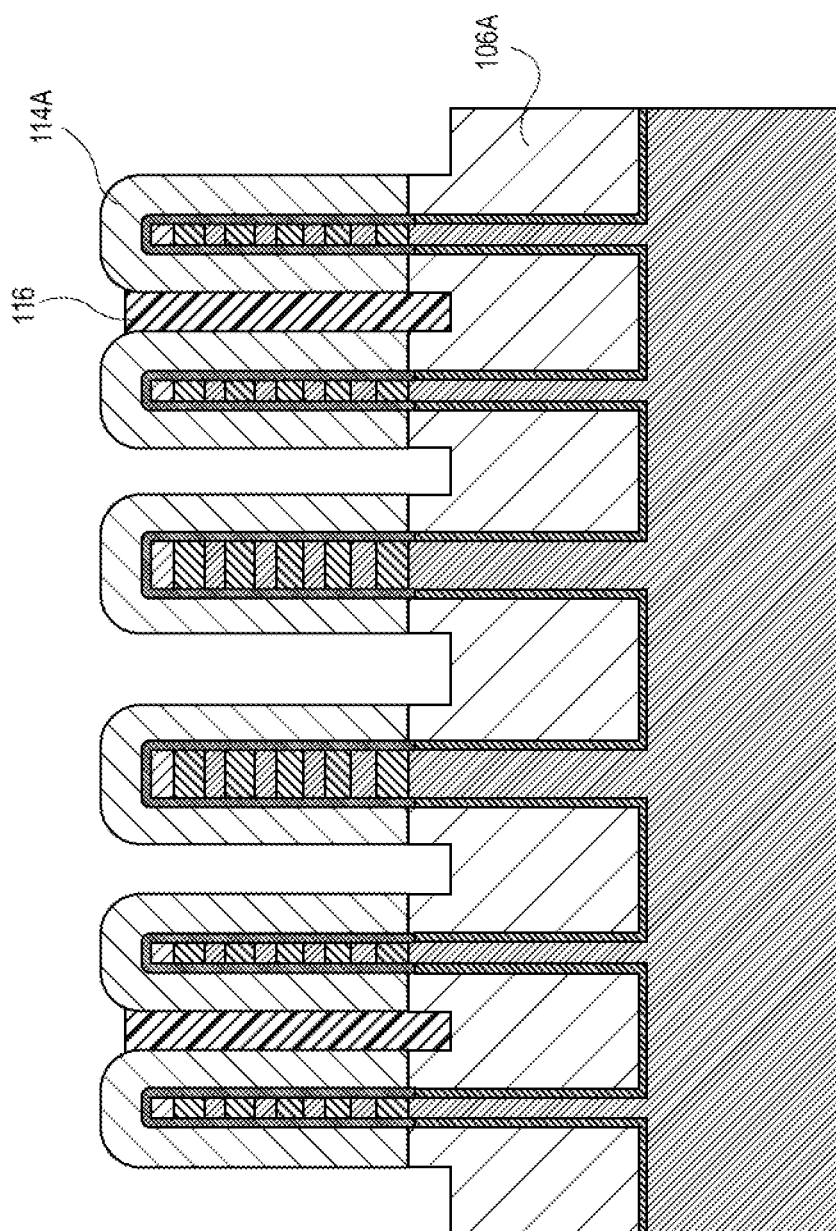

Referring to FIG. 1B, a fin cut is illustrated following anchor spacer etch back. The sacrificial spacer material 114 is anisotropically etched to form patterned sacrificial spacer material portions 114A. Each of the sacrificial spacer material portions 114A is over a corresponding one of the fins 108. In one embodiment, the etch process forms trenches into the isolation structures 106 to form patterned isolation structures 106A, as is depicted. Referring again to FIG. 1B, an anchor-blocking hardmask material 116, such as a carbon based hardmask material, is patterned to be retained between select ones of the fins 108.

Figure 1C:
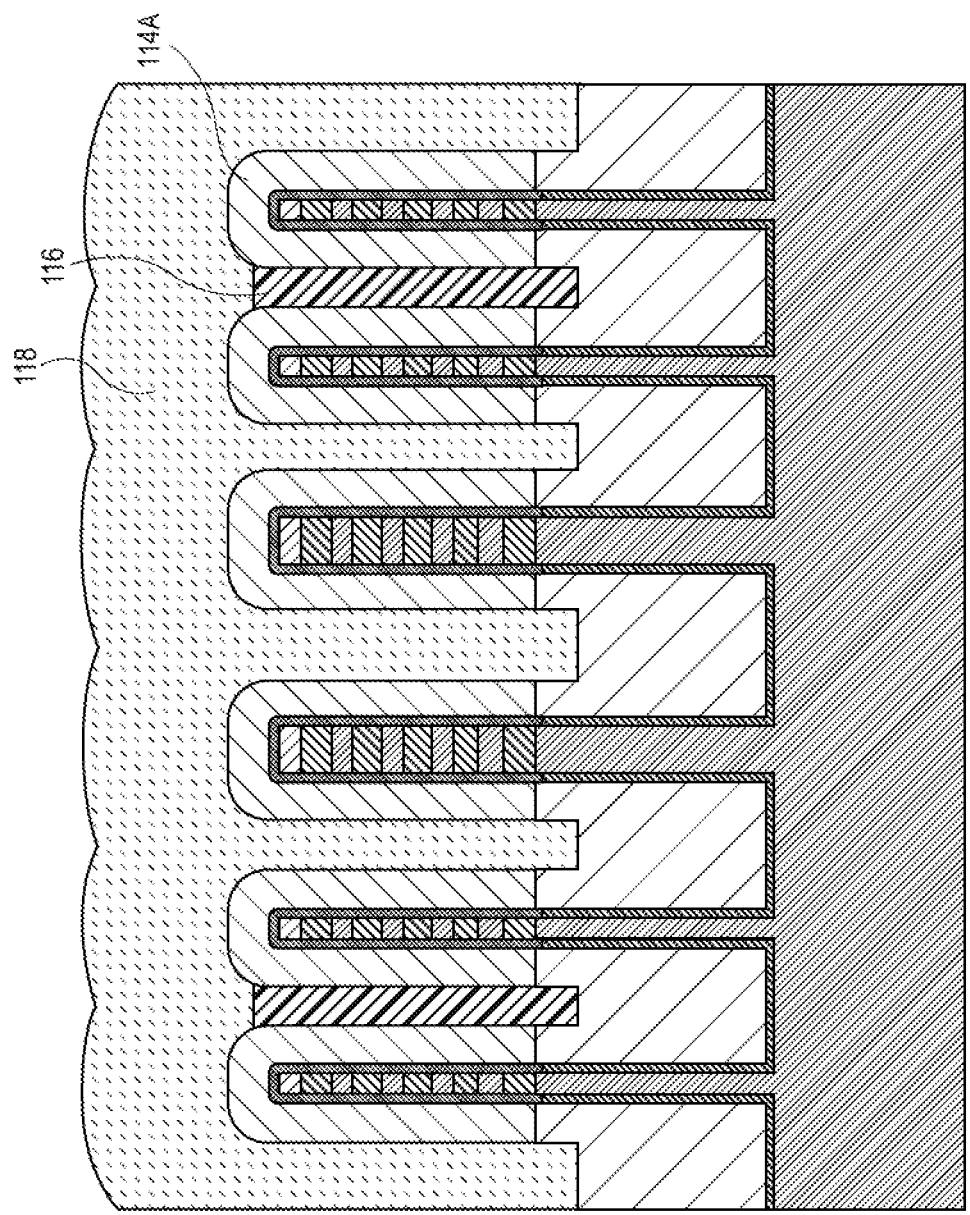

Referring to FIG. 1C, a fin cut is illustrated following material fill for anchor formation. A hardmask material 118, such as a silicon oxynitride or silicon nitride material, is formed between adjacent patterned sacrificial spacer material portions 114A, e.g., by a deposition and planarization process. However, locations including the anchor-blocking hardmask material 116 block fill with the sacrificial hardmask material 118.

Figure 1D:
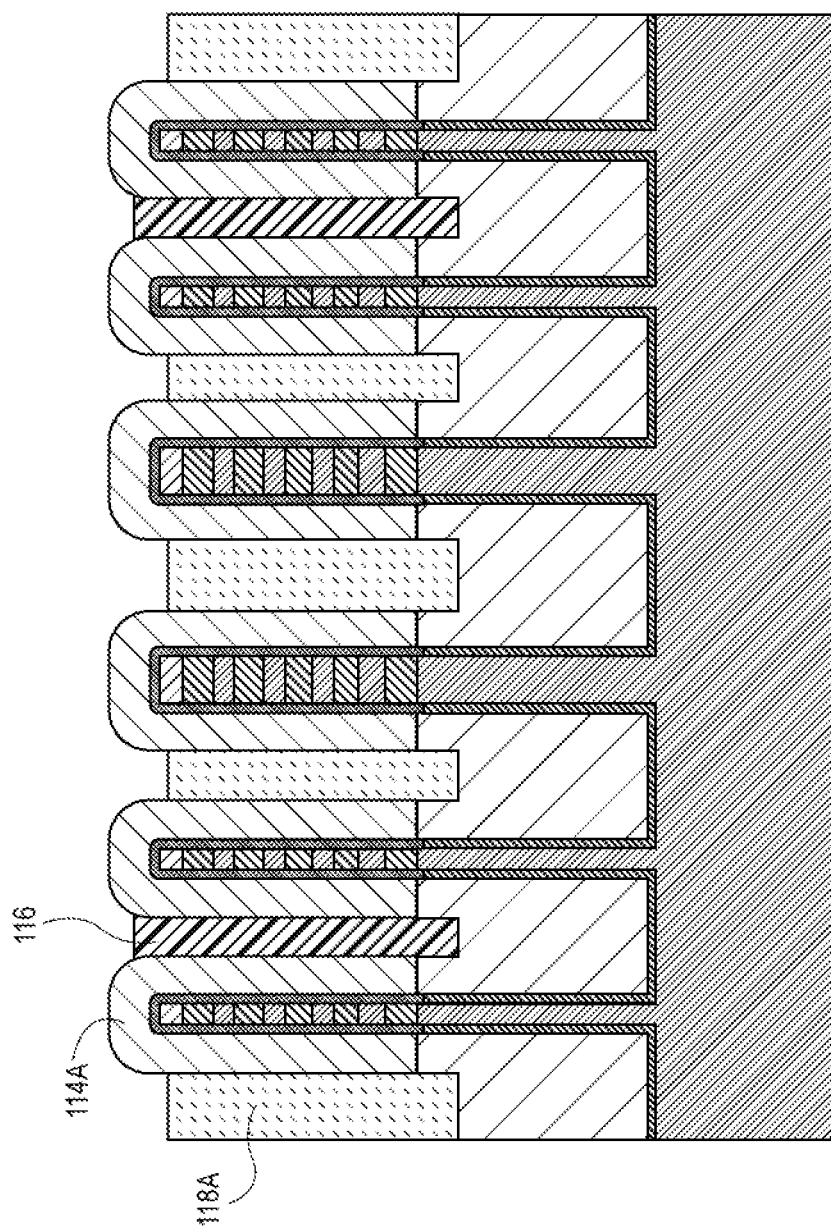

Referring to FIG. 1D, a fin cut is illustrated following anchor formation. The hardmask material 118 is recessed, e.g., by an etch-back process, to form recessed hardmask material 118A.

Figure 1E:
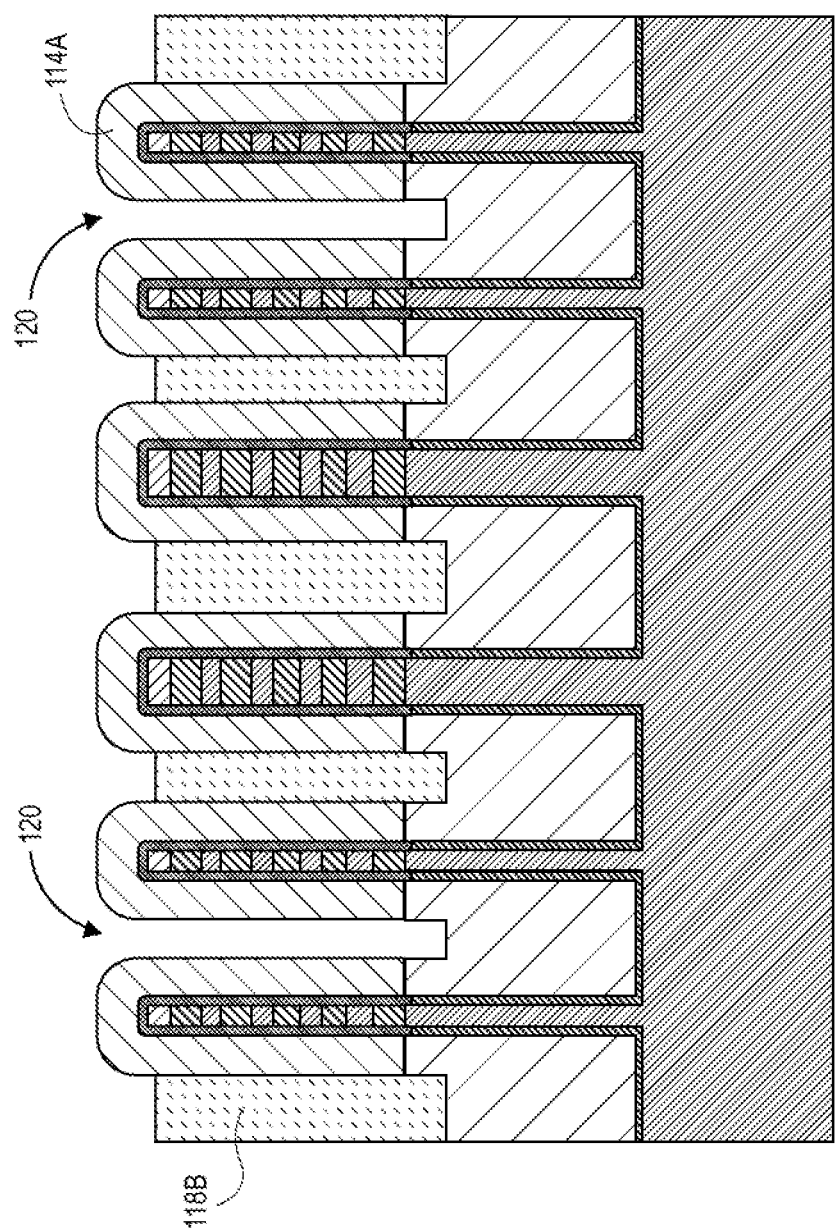

Referring to FIG. 1E, the anchor-blocking hardmask material 116 is removed from the structure of FIG. 1D. Removal of the anchor-blocking hardmask material 116 forms anchor voids 120 (e.g., locations where anchor formation was blocked).

Figure 1F:
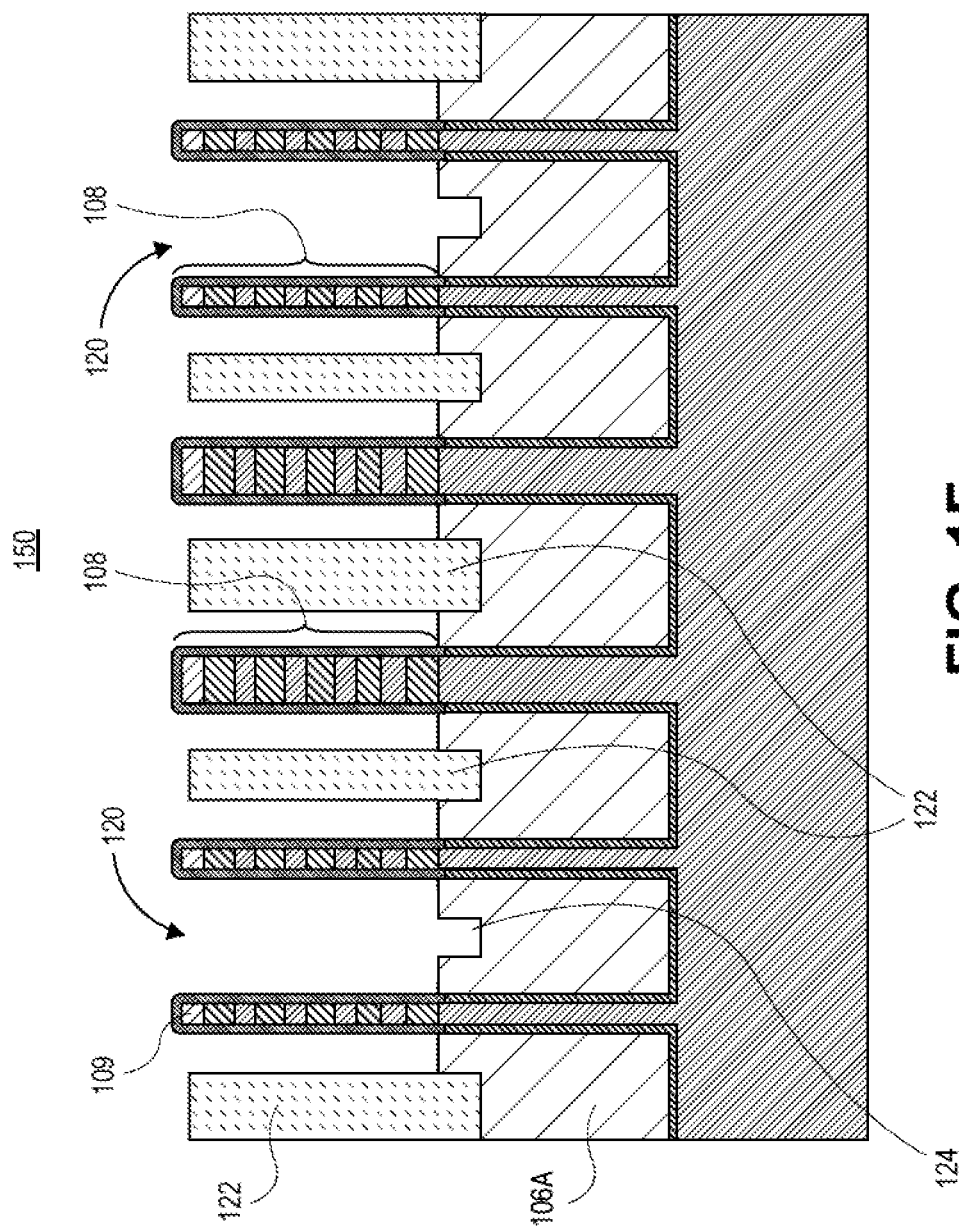

Referring to FIG. 1F, the patterned sacrificial spacer material portions 114A is removed from the structure of FIG. 1E. Removal of the patterned sacrificial spacer material portions 114A forms anchors 122 and leaves anchor voids 120 remaining. In one embodiment, a trench 124 remains within a top surface of the patterned isolation structure 106A in locations each anchor void 120, as is depicted. Each anchor 122 can be viewed as being recessed into the corresponding patterned isolation structure 106A portion.

Figure 2A:
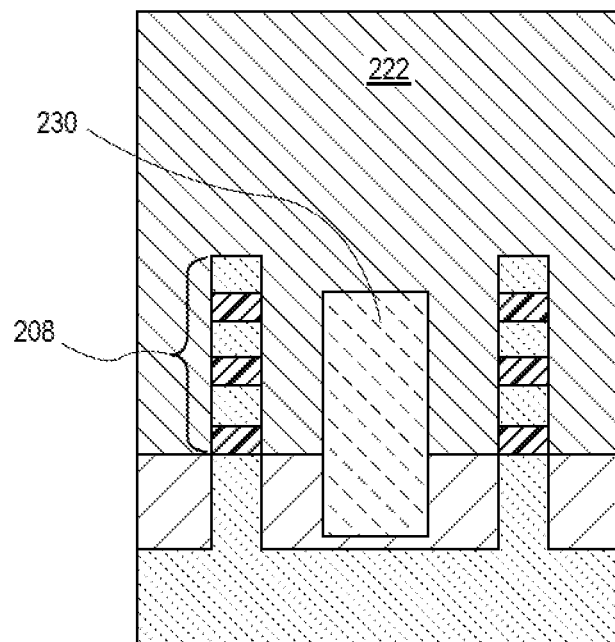
FIGS. 2A-2C illustrates cross-sectional views representing various operations in a method of fabricating an integrated circuit structure having a metal gate plug landed on a dielectric anchor, in accordance with an embodiment of the present disclosure.
Figure 2B:
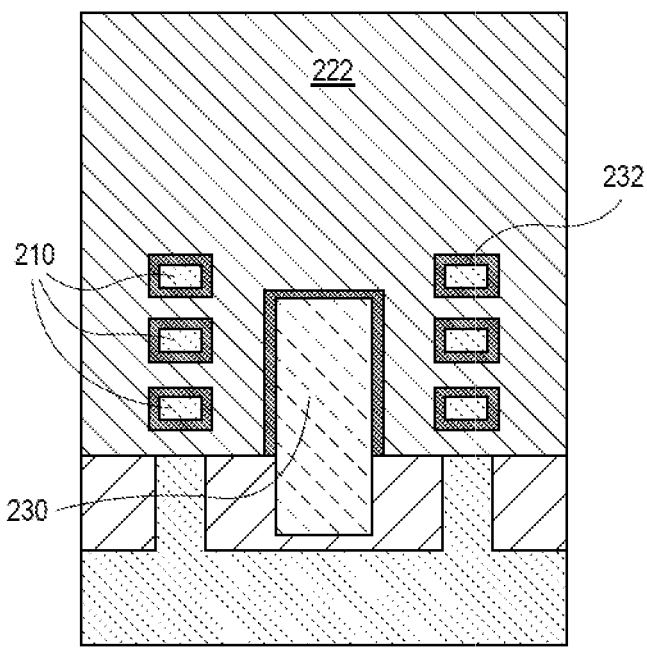
Figure 2C:
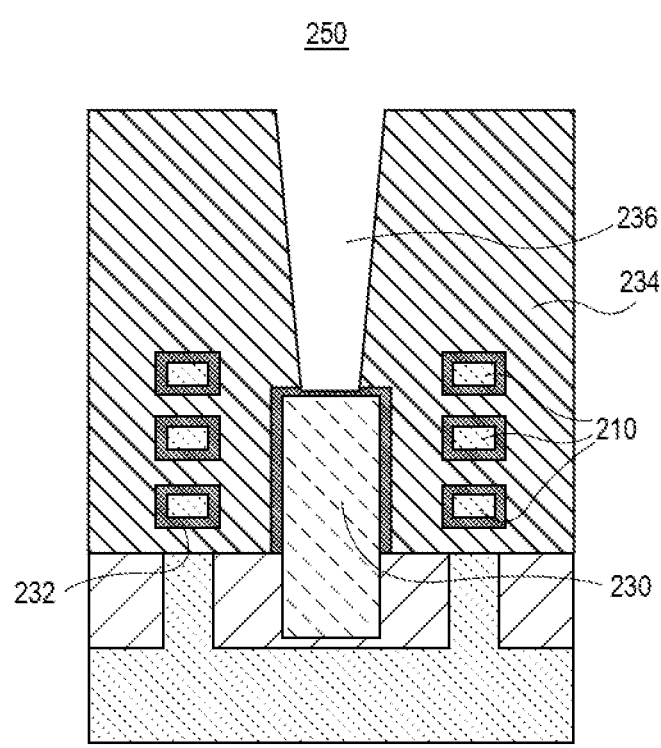

It is to be appreciated that further processing of the structure of FIG. 1F can include dummy gate formation, gate spacer formation, nanowire release, and permanent gate structure formation. In one aspect, a metal gate cut process is implemented subsequent to completing gate dielectric and work function metal deposition and patterning. The metal gate process can land on a protruding gate cut landing structure, or dielectric anchor, so that the gate cut depth is reduced relative to a gate cut through an entire height of the gate stack. As an example, FIGS. 2A-2C illustrates cross-sectional views representing various operations in a method of fabricating an integrated circuit structure having a metal gate plug landed on a dielectric anchor, in accordance with an embodiment of the present disclosure. It is to be appreciated that the embodiments described and illustrated may also be applicable for a fin structure in place of a stack of nanowires.

Referring to FIG. 2A, processing between FIG. 1F and FIG. 2A can include dummy gate patterning, such as polysilicon dummy gate patterning. Gate spacers, such as silicon nitride gate spacers, are formed along sides of the dummy gate. Removal of the dummy gate reveals gate spacers 222 (one shown into the page with the understanding that another gate spacer is out of the page. In the view of FIG. 2A, fins 208 are depicted, and long with a dielectric anchor 230.

Referring to FIG. 2B, a sacrificial material is removed from the fins 208 in the channel region (under gate) to release nanowires 210. A gate dielectric material 232, such as a high-k gate dielectric material, is then formed on the released nanowires 208 and, possibly on the dielectric anchor 230, as is depicted.

Referring to FIG. 2C, a fin cut in gate is illustrated following metal gate deposition and end-to-end plug etch. A gate electrode structure 234, such as a stack of metal-containing layers, is formed on the structure of FIG. 2B. It is to be appreciated that the gate spacer 222 shown in FIG. 2B would be on either side (i.e., into and out of the page) of the gate electrode structure 234. A gate cut 236 is then made in the gate electrode structure 234 and possibly into the gate dielectric material 232 to provide a structure 250.

Subsequent processing can involve filling the gate cut 236 to form a gate plug, e.g., to provide a metal gate plug landed on a dielectric anchor. In one embodiment, description of a gate plug landed on a dielectric anchor refers to a structure including a gate plug formed on or into a gate dielectric layer (e.g., 232) on a dielectric anchor. In another embodiment, description of a gate plug landed on a dielectric anchor refers to a structure including a gate plug formed in direct contact with a dielectric anchor. In one example of the latter embodiment, a gate plug formed entirely through a gate dielectric layer (e.g., 232) on a dielectric anchor. In another example of the latter embodiment, a gate dielectric layer is not formed on a dielectric anchor.

Figure 3:
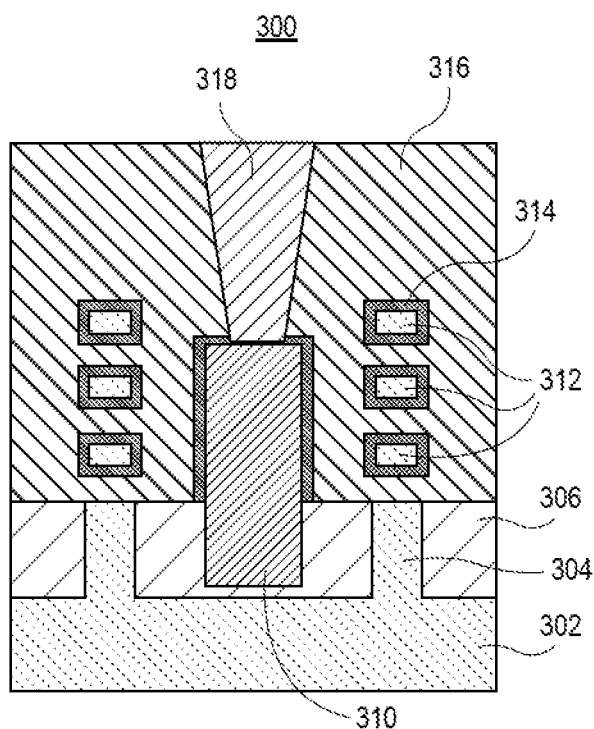
FIG. 3 illustrates a cross-sectional view of an integrated circuit structure having a metal gate plug landed on a dielectric anchor, in accordance with an embodiment of the present disclosure.
Figure 4:
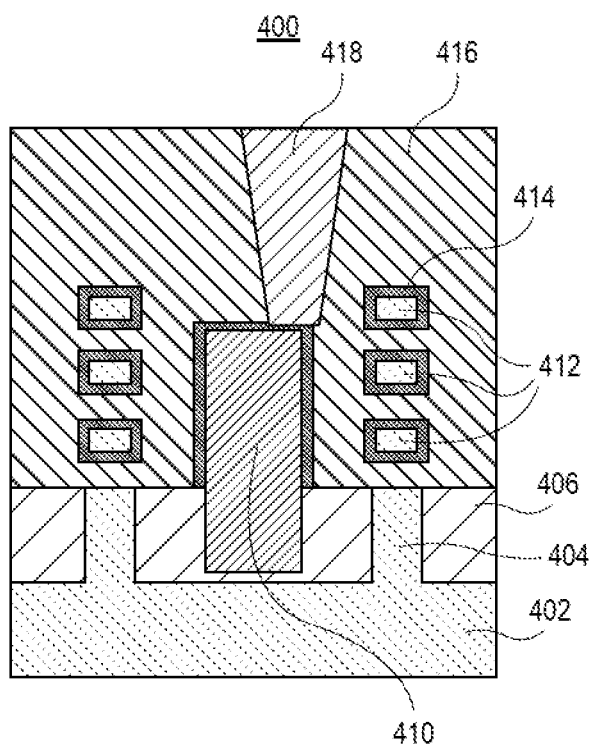
FIG. 4 illustrates a cross-sectional view of another integrated circuit structure having a metal gate plug landed on a dielectric anchor, in accordance with another embodiment of the present disclosure.

In another aspect, a gate plug may be aligned (e.g., FIG. 3) or may not be self-aligned (e.g., FIG. 4). In either case, in an embodiment, an anchor is in the middle of two transistors.

In an example, FIG. 3 illustrates a cross-sectional view of an integrated circuit structure having metal gate plug landed on dielectric anchor, in accordance with an embodiment of the present disclosure. It is to be appreciated that the embodiments described and illustrated may also be applicable for a fin structure in place of a stack of nanowires.

Referring to FIG. 3, an integrated circuit structure 300 includes a substrate 302 having sub-fins 304 in an isolation structure 306. A stack of nanowires 312 is over each of the sub-fins 304. A gate dielectric layer 314 is around the stacks of nanowires 312. A dielectric anchor 310 is between two stacks of nanowires 312. The gate dielectric layer 314 may further be on the dielectric anchor 310, as is depicted. A gate electrode 316 is over the gate dielectric layer 314. A gate cut plug 318 is between two portions of the gate electrode 316. In one embodiment, the gate cut plug 318 is in vertical alignment with the dielectric anchor 310, as is depicted.

In an embodiment, the dielectric anchor 310 has a bottommost surface below an uppermost surface of the isolation structure 306. In other embodiments, the dielectric anchor 310 has an uppermost surface below an uppermost surface of the stacks of nanowires 312. In other embodiments, the dielectric anchor 310 has an uppermost surface co-planar with or above an uppermost surface of the stacks of nanowires 312.

In another example, FIG. 4 illustrates a cross-sectional view of another integrated circuit structure having metal gate plug landed on dielectric anchor, in accordance with another embodiment of the present disclosure. It is to be appreciated that the embodiments described and illustrated may also be applicable for a fin structure in place of a stack of nanowires.

Referring to FIG. 4, an integrated circuit structure 400 includes a substrate 402 having sub-fins 404 in an isolation structure 406. A stack of nanowires 412 is over each of the sub-fins 404. A gate dielectric layer 414 is around the stacks of nanowires 412. A dielectric anchor 410 is between two stacks of nanowires 412. The gate dielectric layer 414 may further be on the dielectric anchor 410, as is depicted. A gate electrode 416 is over the gate dielectric layer 414. A gate cut plug 418 is between two portions of the gate electrode 416. In one embodiment, the gate cut plug 418 is not in vertical alignment with (i.e., is offset from) the dielectric anchor 410, as is depicted.

In an embodiment, the dielectric anchor 410 has a bottommost surface below an uppermost surface of the isolation structure 406. In other embodiments, the dielectric anchor 410 has an uppermost surface below an uppermost surface of the stacks of nanowires 412. In other embodiments, the dielectric anchor 410 has an uppermost surface co-planar with or above an uppermost surface of the stacks of nanowires 412.

With reference again to FIGS. 3 and 4, in accordance with an embodiment of the present disclosure, an integrated circuit structure 300 or 400 includes a sub-fin 304 or 404 in a shallow trench isolation (STI) structure 306 or 406. A plurality of horizontally stacked nanowires 312 or 412 is over the sub-fin 304 or 404. A gate dielectric material layer 314 or 414 is surrounding the horizontally stacked nanowires. A gate electrode structure 316 or 416 is over the gate dielectric material layer 314 or 414. A dielectric anchor 310 or 410 is laterally spaced apart from the plurality of horizontally stacked nanowires 312 or 412. In one embodiment, the dielectric anchor 310 or 410 has a bottommost surface below an uppermost surface of the STI structure 306 or 406, as is depicted in FIGS. 3 and 4. A dielectric gate plug 318 or 418 is on the dielectric anchor 310 or 410.

In an embodiment, the dielectric anchor 310 or 410 has an uppermost surface below an uppermost surface of the plurality of horizontally stacked nanowires 312 or 412, as is depicted in FIGS. 3 and 4. In other embodiments, the dielectric anchor 310 or 410 has an uppermost surface co-planar with or above an uppermost surface of the plurality of horizontally stacked nanowires 312 or 412.

In an embodiment, the dielectric gate plug 318 is vertically on-set with the dielectric anchor 310, as is depicted in FIG. 3. In another embodiment, the dielectric gate plug 418 is vertically offset from the dielectric anchor 410, as is depicted in FIG. 4.

In an embodiment, the gate dielectric material layer 314 or 414 is a high-k gate dielectric layer. In an embodiment, the gate electrode structure 316 or 416 includes a workfunction metal layer and a conductive gate fill material.

In an embodiment, the gate dielectric material layer 314 or 414 is not along sides of the dielectric gate plug 318 or 418, as is depicted in FIGS. 3 and 4. In one such embodiment, the gate electrode structure 316 or 416 is in contact with the sides of the dielectric gate plug 318 or 418, as is depicted in FIGS. 3 and 4.

In another aspect, advantages for implementing approaches described herein can include a reduced depth gate cut for gate isolation. Advantages for implementing approaches described herein can also include a so-called "plug-last" approach with a result that a gate dielectric layer (such as a high-k gate dielectric layer) is not deposited on a gate plug sidewall, effectively saving additional room for work function metal deposition. By contrast, a metal gate fill material can pinch between the plug and fin during a so-called conventional "plug-first" approach. The space for metal fill can be narrower due to plug mis-registration in the latter approach, and can result in voids during metal fill. In embodiments described herein, using a "plug-last" approach, a work function metal deposition can be seamless (e.g., void free).

In accordance with one or more embodiments of the present disclosure, an integrated circuit structure has a clean interface between a dielectric gate plug and a gate metal. It is to be appreciated that many embodiments can benefit from approaches described herein, such as plug-last approaches. For example, a metal gate cut can be implemented for a FinFET device. A metal gate cut scheme can be implemented for a gate all around (GAA) device.

Figure 5:
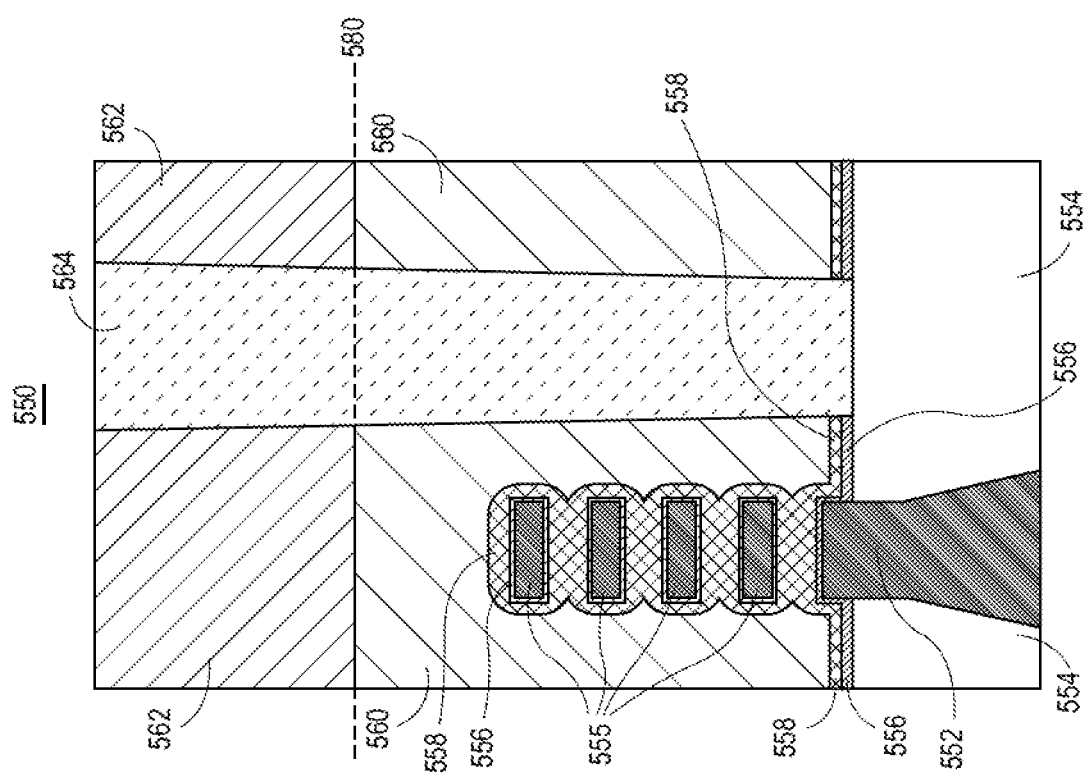
FIG. 5 illustrates a cross-sectional view of an integrated circuit structure having nanowires and a cut metal gate dielectric plug.

As a comparative example not including a gate cut landing structure, FIG. 5 illustrates a cross-sectional view of an integrated circuit structure having nanowires and a cut metal gate dielectric plug.

Referring to FIG. 5, an integrated circuit structure 550 includes a sub-fin 552 having a portion protruding above a shallow trench isolation (STI) structure 554. A plurality of horizontally stacked nanowires 555 is over the sub-fin 552. A gate dielectric material layer 556, such as a high-k gate dielectric layer, is over the protruding portion of the sub-fin 552, over the STI structure 554, and surrounding the horizontally stacked nanowires 555. It is to be appreciated that, although not depicted, an oxidized portion of the sub-fin 552 may be between the protruding portion of the sub-fin 552 and the gate dielectric material layer 556, and between the horizontally stacked nanowires 555 and the gate dielectric material layer 556, and may be included together with the gate dielectric material layer 556 to form a gate dielectric structure. A conductive gate layer 558, such as a workfunction metal layer, is over the gate dielectric material layer 556, and may be directly on the gate dielectric material layer 556 as is depicted. A conductive gate fill material 560 is over the conductive gate layer 558, and may be directly on the conductive gate layer 558 as is depicted. A dielectric gate cap 562 is on the conductive gate fill material 560. A dielectric gate plug 564 is laterally spaced apart from the sub-fin 552 and the plurality of horizontally stacked nanowires 555, and is on, but is not through, the STI structure 554. However, the gate dielectric material layer 556 and the conductive gate layer 558 are not along sides of the dielectric gate plug 564. Instead, the conductive gate fill material 560 is in contact with the sides of the dielectric gate plug 564. As a result, a region between the dielectric gate plug 564 and the combination of the sub-fin 552 and the plurality of horizontally stacked nanowires 555 includes only one layer of the gate dielectric material layer 556 and only one layer of the conductive gate layer 558 alleviating space constraints in such a tight region of the structure 550.

Referring again to FIG. 5, in an embodiment, the dielectric gate plug 564 is formed after forming the gate dielectric material layer 556, the conductive gate layer 558, and the conductive gate fill material 560. As a result, the gate dielectric material layer 556 and the conductive gate layer 558 are not formed along sides of the dielectric gate plug 564. In an embodiment, the dielectric gate plug 564 has an uppermost surface co-planar with an uppermost surface of the dielectric gate cap 562, as is depicted. In another embodiment, not depicted, a dielectric gate cap 562 is not included, and the dielectric gate plug 564 has an uppermost surface co-planar with an uppermost surface of the conductive gate fill material 560, e.g., along a plane 580.

Figure 6:
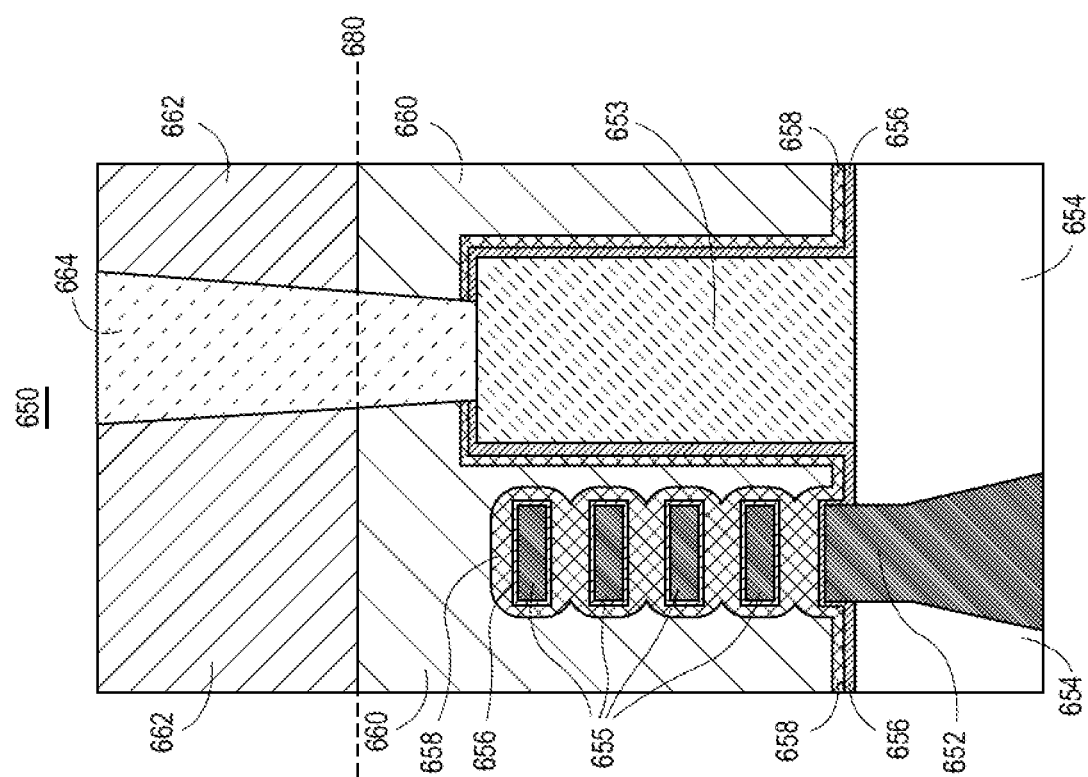
FIG. 6 illustrates a cross-sectional view of an integrated circuit structure having nanowires and a cut metal gate dielectric plug, in accordance with an embodiment of the present disclosure.

By contrast to FIG. 5, as an example including a gate cut landing structure, FIG. 6 illustrates a cross-sectional view of an integrated circuit structure having nanowires and a cut metal gate dielectric plug, in accordance with an embodiment of the present disclosure.

Referring to FIG. 6, an integrated circuit structure 650 includes a sub-fin 652 having a portion protruding above a shallow trench isolation (STI) structure 654. A plurality of horizontally stacked nanowires 655 is over the sub-fin 652. A gate end cap structure 653, such as a self-aligned gate end cap structure, is on, but is not through, the STI structure 654 and is laterally spaced apart from the sub-fin 652 and the plurality of horizontally stacked nanowires 655. A gate dielectric material layer 656, such as a high-k gate dielectric layer, is over the protruding portion of the sub-fin 652, over the STI structure 654, along sides of the gate end cap structure 653, and surrounding the horizontally stacked nanowires 655. It is to be appreciated that, although not depicted, an oxidized portion of the sub-fin 652 may be between the protruding portion of the sub-fin 652 and the gate dielectric material layer 656, and between the horizontally stacked nanowires 655 and the gate dielectric material layer 656, and may be included together with the gate dielectric material layer 656 to form a gate dielectric structure. A conductive gate layer 658, such as a workfunction metal layer, is over the gate dielectric material layer 656, and may be directly on the gate dielectric material layer 656 as is depicted. A conductive gate fill material 660 is over the conductive gate layer 658, and may be directly on the conductive gate layer 658 as is depicted. A dielectric gate cap 662 is on the conductive gate fill material 660. A dielectric gate plug 664 is on the gate end cap structure 653.

However, the gate dielectric material layer 656 and the conductive gate layer 658 are not along sides of the dielectric gate plug 664. Instead, the conductive gate fill material 660 is in contact with the sides of the dielectric gate plug 664.

Referring again to FIG. 6, in an embodiment, the dielectric gate plug 664 is formed after forming the gate dielectric material layer 656, the conductive gate layer 658, and the conductive gate fill material 660. As a result, the gate dielectric material layer 656 and the conductive gate layer 658 are not formed along sides of the dielectric gate plug 664. In an embodiment, the dielectric gate plug 664 has an uppermost surface co-planar with an uppermost surface of the dielectric gate cap 662, as is depicted. In another embodiment, not depicted, a dielectric gate cap 662 is not included, and the dielectric gate plug 664 has an uppermost surface co-planar with an uppermost surface of the conductive gate fill material 660, e.g., along a plane 680. It is to be appreciated that gate end cap structure 653 is depicted as having a bottommost surface on an uppermost surface of the STI structure 654, in accordance with one embodiment. In other embodiments, the gate end cap structure 653 has a bottommost surface below an uppermost surface of the STI structure 654, such as described above in association with FIGS. 2, 3 and 4.

In an embodiment, a metal work function can be: (a) a same metal system in NMOS and PMOS, (b) different metal system between NMOS and PMOS, and/or (c) single material or multi-layer metals (e.g.: W, TiN, TixAlyCz, TaN, Mo, MoN). In an embodiment, a metal cut etch chemistry includes chlorine-containing or fluorine-containing etchants, with possible additional carbon- or silicon-containing components providing passivation.

It is to be appreciated that the embodiments described herein can also include other implementations such as nanowires and/or nanoribbons with various widths, thicknesses and/or materials including but not limited to Si and SiGe. For example, group III-V materials may be used.

It is to be appreciated that, in a particular embodiment, nanowires or nanoribbons, or sacrificial intervening layers, may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, nanowires or nanoribbons, or sacrificial intervening layers, may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

Described below are various devices and processing schemes that may be used to fabricate a device that can be integrated with a structure including a metal gate plug landed on dielectric anchor and/or a structure including a dielectric anchor void. It is to be appreciated that the exemplary embodiments need not necessarily require all features described, or may include more features than are described. For example, nanowire release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a back-side interconnect level.

As an exemplary process flow for fabricating a gate-all-around device of a gate-all-around integrated circuit structure, FIGS. 7A-7J illustrates cross-sectional views of various operations in a method of fabricating a gate-all-around integrated circuit structure, in accordance with an embodiment of the present disclosure.

Figure 7B:
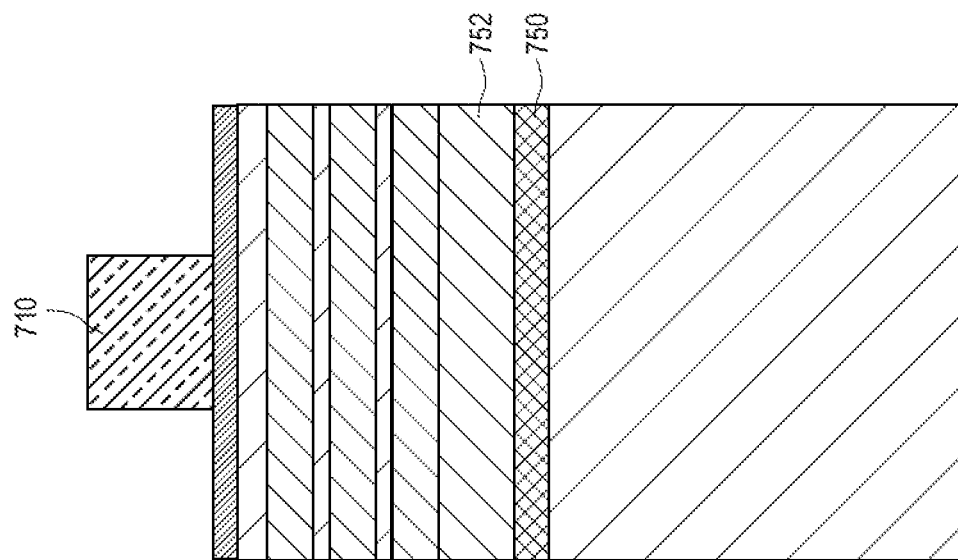
Figure 7A:
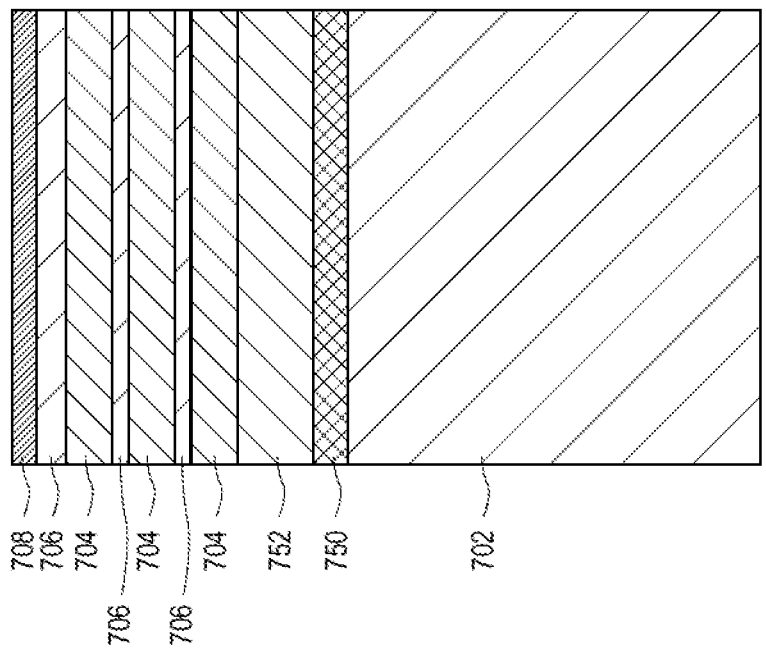

Referring to FIG. 7A, a method of fabricating an integrated circuit structure includes forming a starting stack which includes alternating sacrificial layers 704 and nanowires 706 above a fin 702, such as a silicon fin. The nanowires 706 may be referred to as a vertical arrangement of nanowires. A protective cap 708 may be formed above the alternating sacrificial layers 704 and nanowires 706, as is depicted. A relaxed buffer layer 752 and a defect modification layer 750 may be formed beneath the alternating sacrificial layers 704 and nanowires 706, as is also depicted.

Referring to FIG. 7B, a gate stack 710 is formed over the vertical arrangement of horizontal nanowires 706. Portions of the vertical arrangement of horizontal nanowires 706 are then released by removing portions of the sacrificial layers 704 to provide recessed sacrificial layers 704' and cavities 712, as is depicted in FIG. 7C.

It is to be appreciated that the structure of FIG. 7C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete source or drain structures.

Figure 7D:
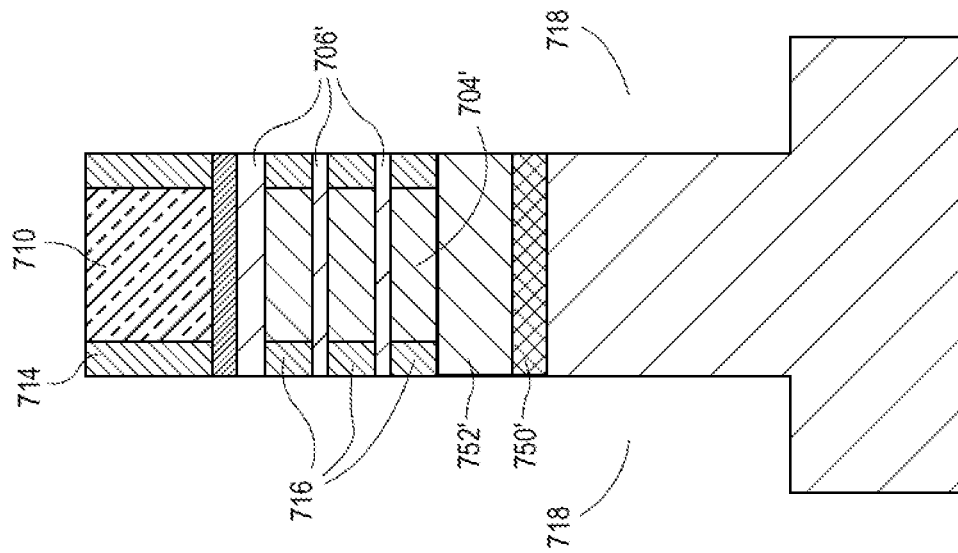
Figure 7C:
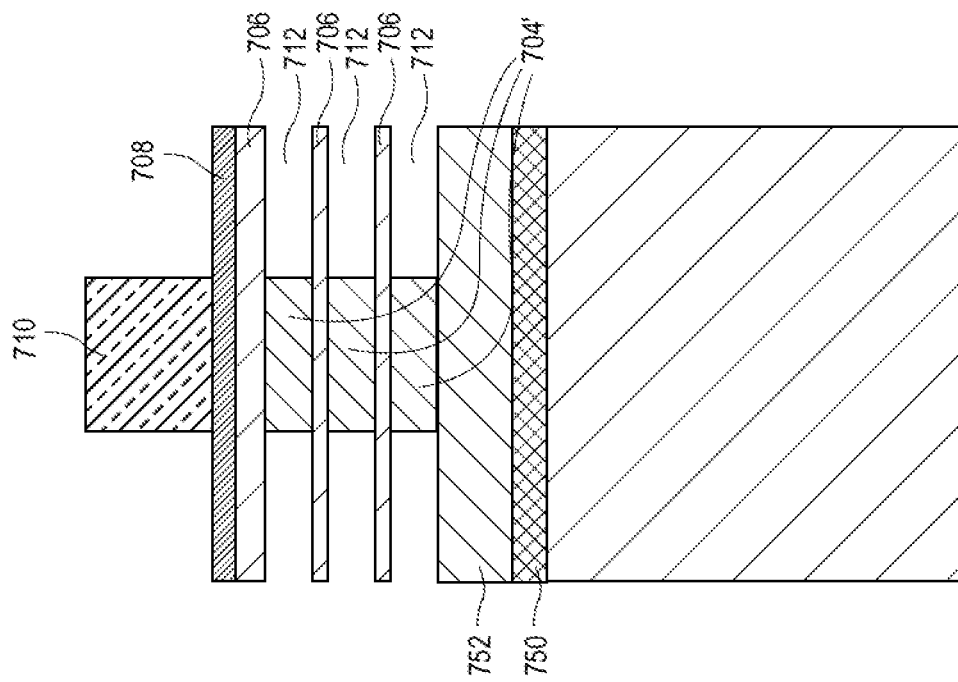

Referring to FIG. 7D, upper gate spacers 714 are formed at sidewalls of the gate structure 710. Cavity spacers 716 are formed in the cavities 712 beneath the upper gate spacers 714. A deep trench contact etch is then optionally performed to form trenches 718 and to form recessed nanowires 706'. A patterned relaxed buffer layer 752' and a patterned defect modification layer 750' may also be present, as is depicted.

A sacrificial material 720 is then formed in the trenches 718, as is depicted in FIG. 7E. In other process schemes, an isolated trench bottom or silicon trench bottom may be used.

Referring to FIG. 7F, a first epitaxial source or drain structure (e.g., left-hand features 722) is formed at a first end of the vertical arrangement of horizontal nanowires 706'. A second epitaxial source or drain structure (e.g., right-hand features 722) is formed at a second end of the vertical arrangement of horizontal nanowires 706'. In an embodiment, as depicted, the epitaxial source or drain structures 722 are vertically discrete source or drain structures and may be referred to as epitaxial nubs.

An inter-layer dielectric (ILD) material 724 is then formed at the sides of the gate electrode 710 and adjacent the source or drain structures 722, as is depicted in FIG. 7G. Referring to FIG. 7H, a replacement gate process is used to form a permanent gate dielectric 728 and a permanent gate electrode 726. The ILD material 724 is then removed, as is depicted in FIG. 7I. The sacrificial material 720 is then removed from one of the source drain locations (e.g., right-hand side) to form trench 732, but is not removed from the other of the source drain locations to form trench 730.

Figure 7J:
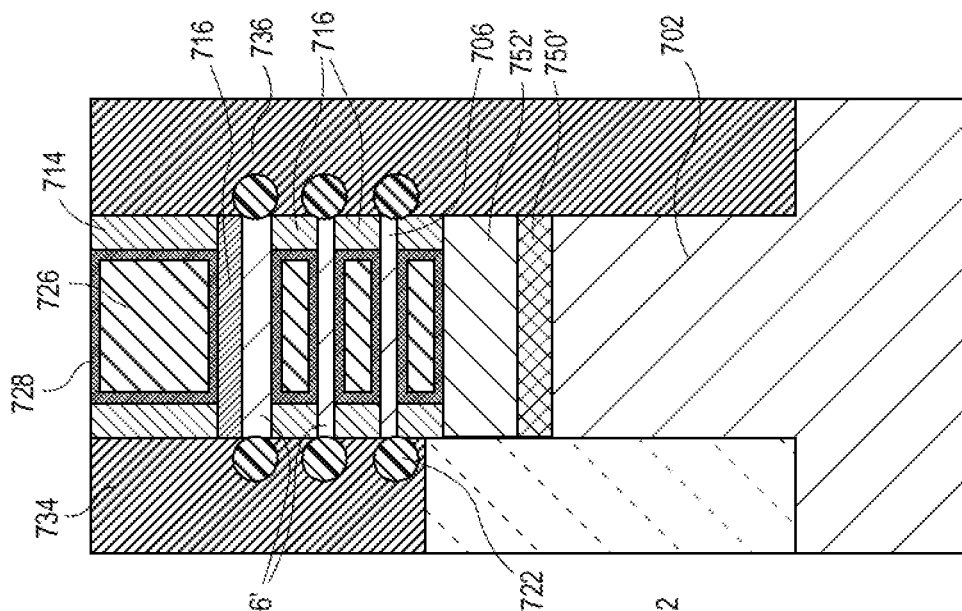
Figure 7I:
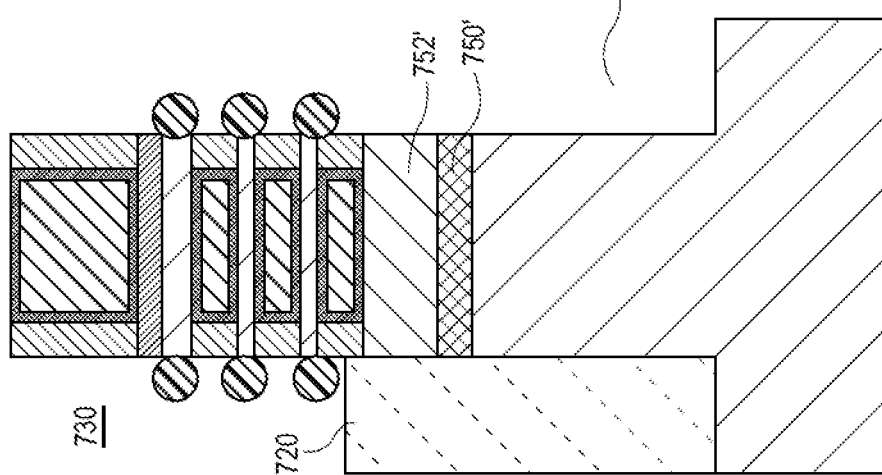
Figure 7H:
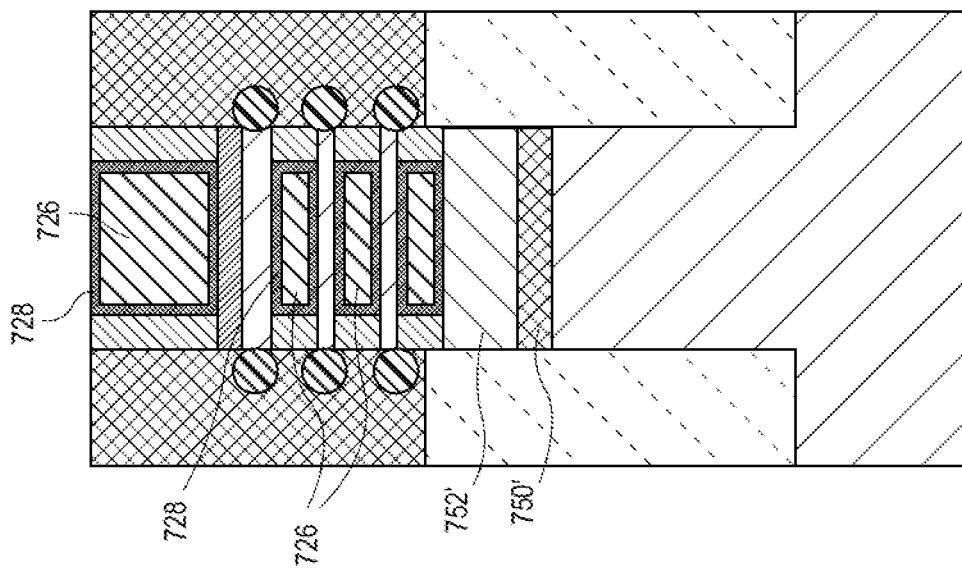

Referring to FIG. 7J, a first conductive contact structure 734 is formed coupled to the first epitaxial source or drain structure (e.g., left-hand features 722). A second conductive contact structure 736 is formed coupled to the second epitaxial source or drain structure (e.g., right-hand features 722). The second conductive contact structure 736 is formed deeper along the fin 702 than the first conductive contact structure 734. In an embodiment, although not depicted in FIG. 7J, the method further includes forming an exposed surface of the second conductive contact structure 736 at a bottom of the fin 702. Conductive contacts may include a contact resistance reducing layer and a primary contact electrode layer, where examples can include Ti, Ni, Co (for the former and W, Ru, Co for the latter.)

In an embodiment, the second conductive contact structure 736 is deeper along the fin 702 than the first conductive contact structure 734, as is depicted. In one such embodiment, the first conductive contact structure 734 is not along the fin 702, as is depicted. In another such embodiment, not depicted, the first conductive contact structure 734 is partially along the fin 702.

In an embodiment, the second conductive contact structure 736 is along an entirety of the fin 702. In an embodiment, although not depicted, in the case that the bottom of the fin 702 is exposed by a back-side substrate removal process, the second conductive contact structure 736 has an exposed surface at a bottom of the fin 702.

In an embodiment, the structure of FIG. 7J, or related structures of FIGS. 7A-7J, can be formed in conjunction with a structure including a metal gate plug landed on dielectric anchor and/or a structure including a dielectric anchor void, such as described in association with FIGS. 1A-1F, 2A-2C, 3, 4 and 6.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performance. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 8 illustrates a cross-sectional view of a non-planar integrated circuit structure as taken along a gate line, in accordance with an embodiment of the present disclosure.

Figure 8:
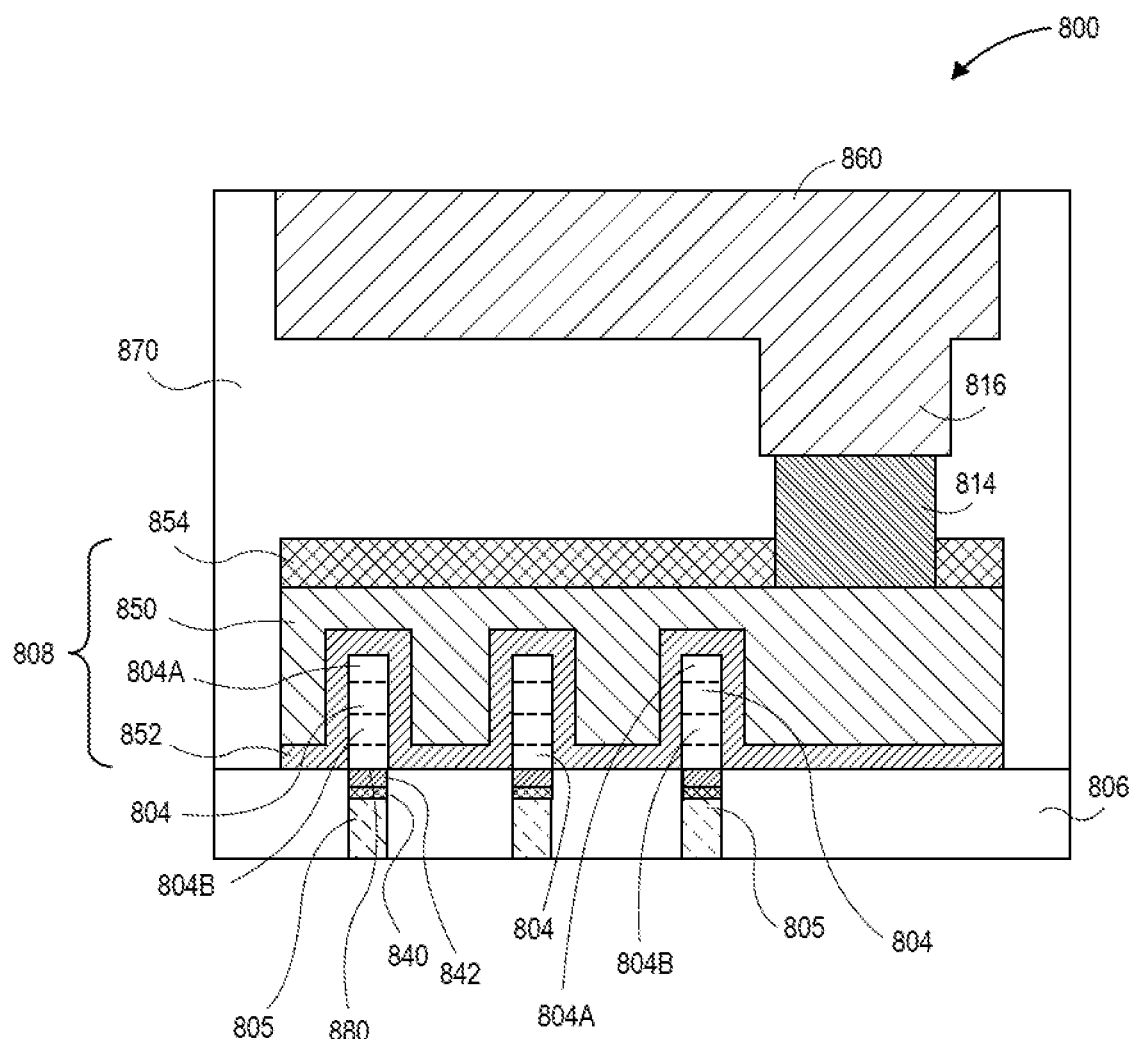
FIG. 8 illustrates a cross-sectional view of a non-planar integrated circuit structure as taken along a gate line, in accordance with an embodiment of the present disclosure.

Referring to FIG. 8, a semiconductor structure or device 800 includes a non-planar active region (e.g., a fin structure including protruding fin portion 804 and sub-fin region 805) within a trench isolation region 806. In an embodiment, instead of a solid fin, the non-planar active region is separated into nanowires (such as nanowires 804A and 804B) above sub-fin region 805, as is represented by the dashed lines. In either case, for ease of description for non-planar integrated circuit structure 800, a non-planar active region 804 is referenced below as a protruding fin portion. In an embodiment, the sub-fin region 805 also includes a relaxed buffer layer 842 and a defect modification layer 840, as is depicted.

A gate line 808 is disposed over the protruding portions 804 of the non-planar active region (including, if applicable, surrounding nanowires 804A and 804B), as well as over a portion of the trench isolation region 806. As shown, gate line 808 includes a gate electrode 850 and a gate dielectric layer 852. In one embodiment, gate line 808 may also include a dielectric cap layer 854. A gate contact 814, and overlying gate contact via 816 are also seen from this perspective, along with an overlying metal interconnect 860, all of which are disposed in inter-layer dielectric stacks or layers 870. Also seen from the perspective of FIG. 8, the gate contact 814 is, in one embodiment, disposed over trench isolation region 806, but not over the non-planar active regions. In another embodiment, the gate contact 814 is over the non-planar active regions.

In an embodiment, the semiconductor structure or device 800 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 808 surround at least a top surface and a pair of sidewalls of the three-dimensional body.

As is also depicted in FIG. 8, in an embodiment, an interface 880 exists between a protruding fin portion 804 and sub-fin region 805. The interface 880 can be a transition region between a doped sub-fin region 805 and a lightly or undoped upper fin portion 804. In one such embodiment, each fin is approximately 10 nanometers wide or less, and sub-fin dopants are optionally supplied from an adjacent solid state doping layer at the sub-fin location. In a particular such embodiment, each fin is less than 10 nanometers wide.

Although not depicted in FIG. 8, it is to be appreciated that source or drain regions of or adjacent to the protruding fin portions 804 are on either side of the gate line 808, i.e., into and out of the page. In one embodiment, the material of the protruding fin portions 804 in the source or drain locations is removed and replaced with another semiconductor material, e.g., by epitaxial deposition to form epitaxial source or drain structures. The source or drain regions may extend below the height of dielectric layer of trench isolation region 806, i.e., into the sub-fin region 805. In accordance with an embodiment of the present disclosure, the more heavily doped sub-fin regions, i.e., the doped portions of the fins below interface 880, inhibits source to drain leakage through this portion of the bulk semiconductor fins. In an embodiment, the source and drain regions have associated asymmetric source and drain contact structures, as described above in association with FIG. 7J.

With reference again to FIG. 8, in an embodiment, fins 804/805 (and, possibly nanowires 804A and 804B) are composed of a crystalline silicon germanium layer which may be doped with a charge carrier, such as but not limited to phosphorus, arsenic, boron, gallium or a combination thereof.

In an embodiment, trench isolation region 806, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region 806 is composed of a dielectric material such as, but not limited to, silicon dioxide, silicon oxy-nitride, silicon nitride, or carbon-doped silicon nitride.

Gate line 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-k material. For example, in one embodiment, the gate dielectric layer 852 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 852 may include a layer of native oxide formed from the top few layers of the substrate fin 804. In an embodiment, the gate dielectric layer 852 is composed of a top high-k portion and a lower portion composed of an oxide of a semiconductor material. In one embodiment, the gate dielectric layer 852 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer 850 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 850 is composed of a non-workfunction-setting fill material formed above a metal workfunction-setting layer. The gate electrode layer 850 may consist of a P-type workfunction metal or an N-type workfunction metal, depending on whether the transistor is to be a PMOS or an NMOS transistor. In some implementations, the gate electrode layer 850 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, tungsten and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 814 and overlying gate contact via 816 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 808 is formed while eliminating the use of a lithographic step with exceedingly tight registration budget. In an embodiment, the contact pattern is a vertically symmetric contact pattern, or an asymmetric contact pattern such as described in association with FIG. 7J. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 800 involves fabrication of the gate stack structure 808 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 8, the arrangement of semiconductor structure or device 800 places the gate contact over isolation regions. Such an arrangement may be viewed as inefficient use of layout space. In another embodiment, however, a semiconductor device has contact structures that contact portions of a gate electrode formed over an active region, e.g., over a fin 805, and in a same layer as a trench contact via.

In an embodiment, the structure of FIG. 8 can be formed in conjunction with a structure including a metal gate plug landed on dielectric anchor and/or a structure including a dielectric anchor void, such as described in association with FIGS. 1A-1F, 2A-2C, 3, 4 and 6.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by gate cut landing structures. Particular embodiments may be directed to integration of multiple width (multi-Wsi) nanowires and nanoribbons in a gate cut landing structure architecture and separated by a gate cut landing structure. In an embodiment, nanowires/nanoribbons are integrated with multiple Wsi in a gate cut landing structure architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

Figure 10:
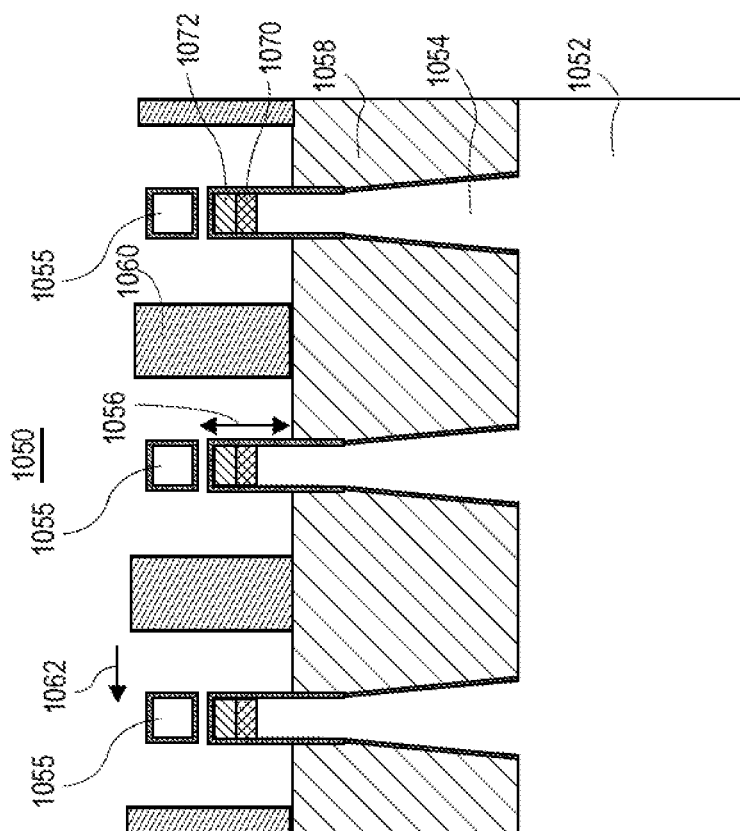
FIG. 10 illustrates a cross-sectional view of a gate cut landing structure architecture, in accordance with an embodiment of the present disclosure
Figure 9:
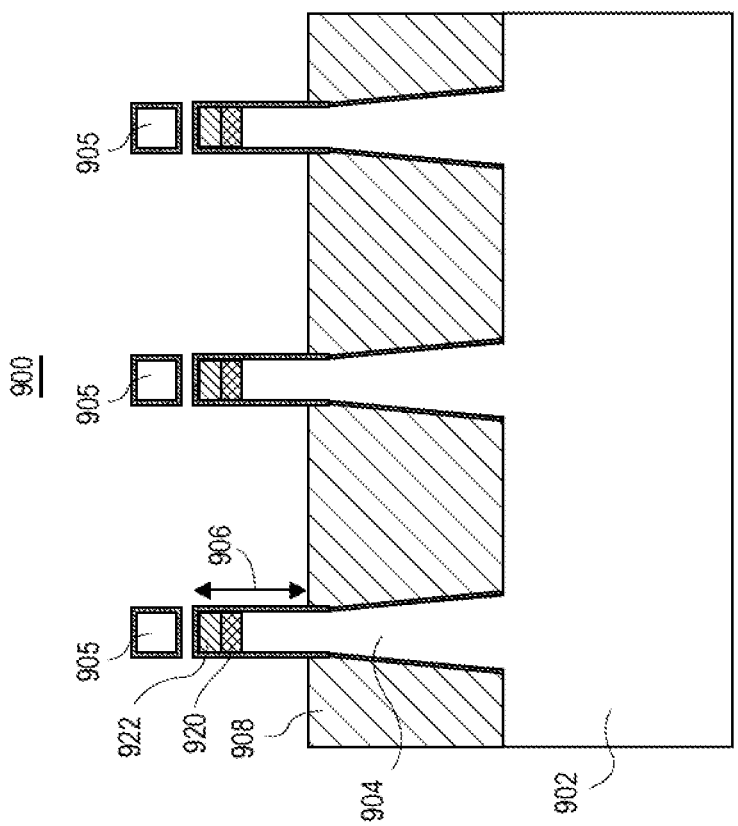
FIG. 9 illustrates a cross-sectional view taken through nanowires and fins for a non-gate cut landing structure architecture.

To provide further context, advantages of a gate cut landing structure architecture may include the enabling of higher layout density and, in particular, scaling of diffusion to diffusion spacing. To provide illustrative comparison, FIG. 9 illustrates a cross-sectional view taken through nanowires and fins for a non-gate cut landing structure architecture. FIG. 10 illustrates a cross-sectional view of a gate cut landing structure architecture, in accordance with an embodiment of the present disclosure.

Referring to FIG. 9, an integrated circuit structure 900 includes a substrate 902 having fins 904 protruding therefrom by an amount 906 above an isolation structure 908 laterally surrounding lower portions of the fins 904. Upper portions of the fins may include a relaxed buffer layer 922 and a defect modification layer 920, as is depicted. Corresponding nanowires 905 are over the fins 904. A gate structure may be formed over the integrated circuit structure 900 to fabricate a device. However, breaks in such a gate structure may be accommodated for by increasing the spacing between fin 904/nanowire 905 pairs.

By contrast, referring to FIG. 10, an integrated circuit structure 1050 includes a substrate 1052 having fins 1054 protruding therefrom by an amount 1056 above an isolation structure 1058 laterally surrounding lower portions of the fins 1054. Upper portions of the fins may include a relaxed buffer layer 1072 and a defect modification layer 1070, as is depicted. Corresponding nanowires 1055 are over the fins 1054. Isolating gate cut landing structures 1060 are included on the isolation structure 1052 and between adjacent fin 1054/nanowire 1055 pairs. The distance between an isolating gate cut landing structure 1060 and a nearest fin 1054/nanowire 1055 pair defines the gate endcap spacing 1062. A gate structure may be formed over the integrated circuit structure 1050, between insolating gate cut landing structures to fabricate a device. Breaks in such a gate structure are imposed by cutting the gate and landing on a gate cut landing structure. In accordance with an embodiment of the present disclosure, a fabrication process for structures associated with FIG. 10 involves use of a process scheme that provides a gate-all-around integrated circuit structure having epitaxial source or drain structures. In an embodiment, the structure of FIG. 10 can be formed in conjunction with a structure including a metal gate plug landed on dielectric anchor and/or a structure including a dielectric anchor void, such as described in association with FIGS. 1A-1F, 2A-2C, 3, 4 and 6.

A gate cut landing structure processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate cut landing structures, and cuts and plugs formed to land on such gate cut landing structures.

In an embodiment, as described throughout, gate cut landing structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

To highlight an exemplary integrated circuit structure having three vertically arranged nanowires, FIG. 11A illustrates a three-dimensional cross-sectional view of a nanowire-based integrated circuit structure, in accordance with an embodiment of the present disclosure. FIG. 11B illustrates a cross-sectional source or drain view of the nanowire-based integrated circuit structure of FIG. 11A, as taken along the a-a' axis. FIG. 11C illustrates a cross-sectional channel view of the nanowire-based integrated circuit structure of FIG. 11A, as taken along the b-b' axis.

Referring to FIG. 11A, an integrated circuit structure 1100 includes one or more vertically stacked nanowires (1104 set) above a substrate 1102. In an embodiment, as depicted, a relaxed buffer layer 1102C, a defect modification layer 1102B, and a lower substrate portion 1102A are included in substrate 1102, as is depicted. An optional fin below the bottommost nanowire and formed from the substrate 1102 is not depicted for the sake of emphasizing the nanowire portion for illustrative purposes. Embodiments herein are targeted at both single wire devices and multiple wire devices. As an example, a three nanowire-based devices having nanowires 1104A, 1104B and 1104C is shown for illustrative purposes. For convenience of description, nanowire 1104A is used as an example where description is focused on one of the nanowires. It is to be appreciated that where attributes of one nanowire are described, embodiments based on a plurality of nanowires may have the same or essentially the same attributes for each of the nanowires.

Each of the nanowires 1104 includes a channel region 1106 in the nanowire. The channel region 1106 has a length (L). Referring to FIG. 11C, the channel region also has a perimeter (Pc) orthogonal to the length (L). Referring to both FIGS. 11A and 11C, a gate electrode stack 1108 surrounds the entire perimeter (Pc) of each of the channel regions 1106. The gate electrode stack 1108 includes a gate electrode along with a gate dielectric layer between the channel region 1106 and the gate electrode (not shown). In an embodiment, the channel region is discrete in that it is completely surrounded by the gate electrode stack 1108 without any intervening material such as underlying substrate material or overlying channel fabrication materials. Accordingly, in embodiments having a plurality of nanowires 1104, the channel regions 1106 of the nanowires are also discrete relative to one another.

Referring to both FIGS. 11A and 11B, integrated circuit structure 1100 includes a pair of non-discrete source or drain regions 1110/1112. The pair of non-discrete source or drain regions 1110/1112 is on either side of the channel regions 1106 of the plurality of vertically stacked nanowires 1104. Furthermore, the pair of non-discrete source or drain regions 1110/1112 is adjoining for the channel regions 1106 of the plurality of vertically stacked nanowires 1104. In one such embodiment, not depicted, the pair of non-discrete source or drain regions 1110/1112 is directly vertically adjoining for the channel regions 1106 in that epitaxial growth is on and between nanowire portions extending beyond the channel regions 1106, where nanowire ends are shown within the source or drain structures. In another embodiment, as depicted in FIG. 11A, the pair of non-discrete source or drain regions 1110/1112 is indirectly vertically adjoining for the channel regions 1106 in that they are formed at the ends of the nanowires and not between the nanowires.

In an embodiment, as depicted, the source or drain regions 1110/1112 are non-discrete in that there are not individual and discrete source or drain regions for each channel region 1106 of a nanowire 1104. Accordingly, in embodiments having a plurality of nanowires 1104, the source or drain regions 1110/1112 of the nanowires are global or unified source or drain regions as opposed to discrete for each nanowire. That is, the non-discrete source or drain regions 1110/1112 are global in the sense that a single unified feature is used as a source or drain region for a plurality (in this case, 3) of nanowires 1104 and, more particularly, for more than one discrete channel region 1106. In one embodiment, from a cross-sectional perspective orthogonal to the length of the discrete channel regions 1106, each of the pair of non-discrete source or drain regions 1110/1112 is approximately rectangular in shape with a bottom tapered portion and a top vertex portion, as depicted in FIG. 11B. In other embodiments, however, the source or drain regions 1110/1112 of the nanowires are relatively larger yet discrete non-vertically merged epitaxial structures such as nubs described in association with FIGS. 7A-7J.

In accordance with an embodiment of the present disclosure, and as depicted in FIGS. 11A and 11B, integrated circuit structure 1100 further includes a pair of contacts 1114, each contact 1114 on one of the pair of non-discrete source or drain regions 1110/1112. In one such embodiment, in a vertical sense, each contact 1114 completely surrounds the respective non-discrete source or drain region 1110/1112. In another aspect, the entire perimeter of the non-discrete source or drain regions 1110/1112 may not be accessible for contact with contacts 1114, and the contact 1114 thus only partially surrounds the non-discrete source or drain regions 1110/1112, as depicted in FIG. 11B. In a contrasting embodiment, not depicted, the entire perimeter of the non-discrete source or drain regions 1110/1112, as taken along the a-a' axis, is surrounded by the contacts 1114.

Referring again to FIG. 11A, in an embodiment, integrated circuit structure 1100 further includes a pair of spacers 1116. As is depicted, outer portions of the pair of spacers 1116 may overlap portions of the non-discrete source or drain regions 1110/1112, providing for "embedded" portions of the non-discrete source or drain regions 1110/1112 beneath the pair of spacers 1116. As is also depicted, the embedded portions of the non-discrete source or drain regions 1110/1112 may not extend beneath the entirety of the pair of spacers 1116.

Substrate 1102 may be composed of a material suitable for integrated circuit structure fabrication. In one embodiment, substrate 1102 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxynitride is on the lower bulk substrate. Thus, the structure 1100 may be fabricated from a starting semiconductor-on-insulator substrate. Alternatively, the structure 1100 is formed directly from a bulk substrate and local oxidation is used to form electrically insulative portions in place of the above described upper insulator layer. In another alternative embodiment, the structure 1100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 1104 may be sized as wires or ribbons, as described below, and may have squared-off or rounder corners. In an embodiment, the nanowires 1104 are composed of a material such as, but not limited to, silicon, germanium, or a combination thereof. In one such embodiment, the nanowires are single-crystalline. For example, for a silicon nanowire 1104, a single-crystalline nanowire may be based from a (100) global orientation, e.g., with a <100> plane in the z-direction. As described below, other orientations may also be considered. In an embodiment, the dimensions of the nanowires 1104, from a cross-sectional perspective, are on the nano-scale. For example, in a specific embodiment, the smallest dimension of the nanowires 1104 is less than approximately 20 nanometers. In an embodiment, the nanowires 1104 are composed of a strained material, particularly in the channel regions 1106.

Referring to FIGS. 11C, in an embodiment, each of the channel regions 1106 has a width (Wc) and a height (Hc), the width (Wc) approximately the same as the height (Hc). That is, in both cases, the channel regions 1106 are square-like or, if corner-rounded, circle-like in cross-section profile. In another aspect, the width and height of the channel region need not be the same, such as the case for nanoribbons as described throughout.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, the structure of FIGS. 11A-11C can be formed in conjunction with a structure including a metal gate plug landed on dielectric anchor and/or a structure including a dielectric anchor void, such as described in association with FIGS. 1A-1F, 2A-2C, 3, 4 and 6.

In an embodiment, as described throughout, an underlying substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron, gallium or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 12:
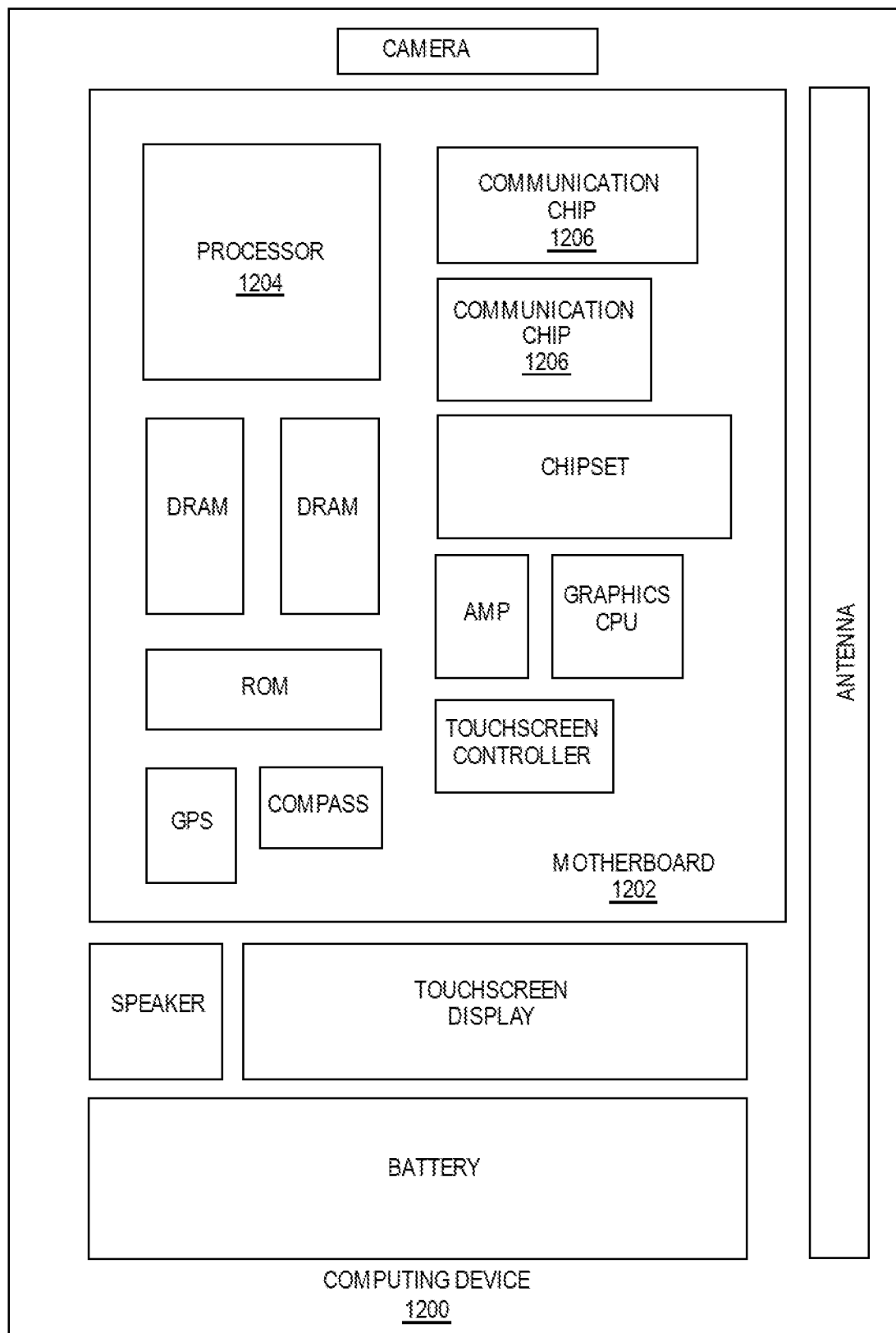
FIG. 12 illustrates a computing device in accordance with one implementation of an embodiment of the disclosure.

FIG. 12 illustrates a computing device 1200 in accordance with one implementation of an embodiment of the present disclosure. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. The integrated circuit die of the processor 1204 may include one or more structures, such as gate-all-around integrated circuit structures having a dielectric anchor and/or a dielectric anchor void, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. The integrated circuit die of the communication chip 1206 may include one or more structures, such as gate-all-around integrated circuit structures having a dielectric anchor and/or a dielectric anchor void, built in accordance with implementations of embodiments of the present disclosure.

In further implementations, another component housed within the computing device 1200 may contain an integrated circuit die that includes one or structures, such as gate-all-around integrated circuit structures having a dielectric anchor and/or a dielectric anchor void, built in accordance with implementations of embodiments of the present disclosure.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
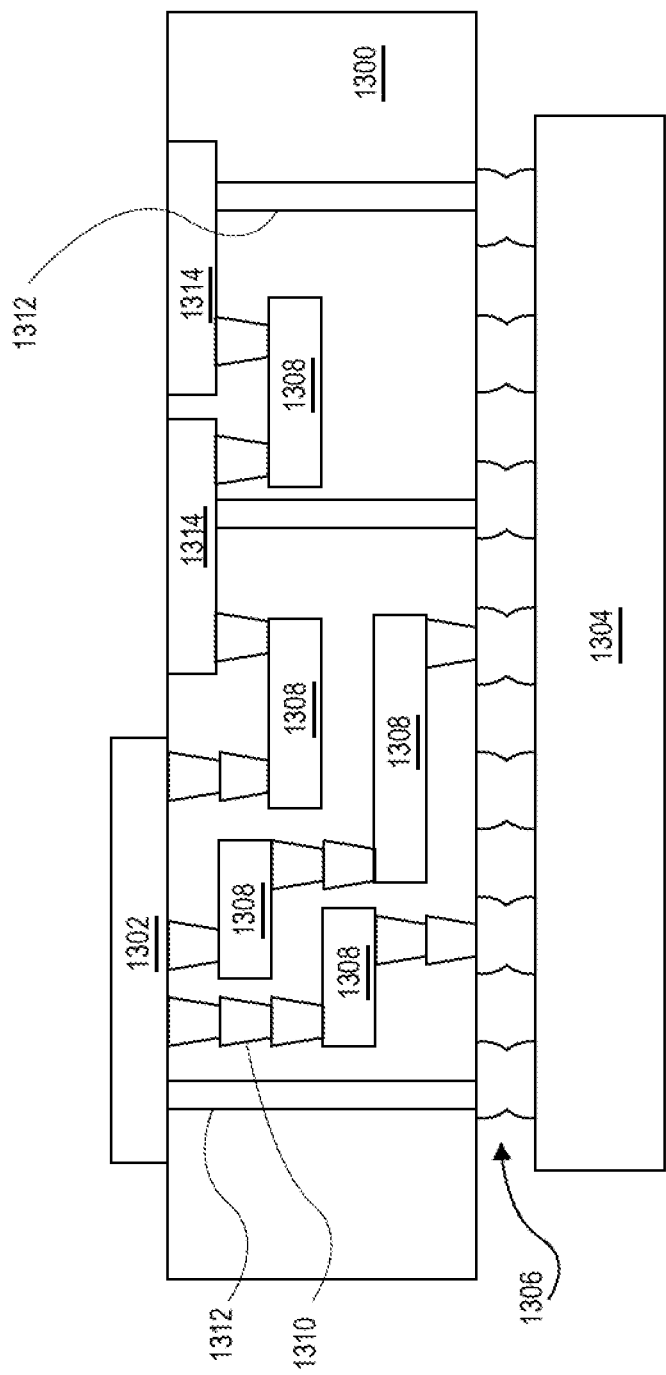
FIG. 13 illustrates an interposer that includes one or more embodiments of the disclosure.

FIG. 13 illustrates an interposer 1300 that includes one or more embodiments of the present disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer 1300 may be formed of alternate rigid or flexible materials that may include the same materials described above for use in a semiconductor substrate, such as silicon, germanium, and other group III-V and group IV materials.

The interposer 1300 may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the disclosure, apparatuses or processes disclosed herein may be used in the fabrication of interposer 1300 or in the fabrication of components included in the interposer 1300.

Thus, embodiments of the present disclosure include integrated circuit structures having a dielectric anchor void, and methods of fabricating integrated circuit structures having a dielectric anchor void.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a sub-fin in a shallow trench isolation (STI) structure. A plurality of horizontally stacked nanowires is over the sub-fin. A gate dielectric material layer is surrounding the horizontally stacked nanowires. A gate electrode structure is over the gate dielectric material layer. A dielectric anchor is laterally spaced apart from the plurality of horizontally stacked nanowires and recessed into a first portion of the STI structure. A second portion of the STI structure on a side of the plurality of horizontally stacked nanowires opposite the dielectric anchor has a trench therein. A dielectric gate plug is on the dielectric anchor.

Example embodiment 2: The integrated circuit structure of example embodiment 1, wherein the dielectric anchor has an uppermost surface below an uppermost surface of the plurality of horizontally stacked nanowires.

Example embodiment 3: The integrated circuit structure of example embodiment 1 or 2, wherein the dielectric gate plug is vertically offset from the dielectric anchor.

Example embodiment 4: The integrated circuit structure of example embodiment 1, 2 or 3, wherein the gate dielectric material layer is a high-k gate dielectric layer, and wherein the gate electrode structure includes a workfunction metal layer and a conductive gate fill material.

Example embodiment 5: The integrated circuit structure of example embodiment 1, 2, 3 or 4, wherein the gate dielectric material layer is not along sides of the dielectric gate plug, and wherein the gate electrode structure is in contact with the sides of the dielectric gate plug.

Example embodiment 6: An integrated circuit structure includes a fin having a portion protruding above a shallow trench isolation (STI) structure. A gate dielectric material layer is over the protruding portion of the fin. A gate electrode structure is over the gate dielectric material layer. A dielectric anchor is laterally spaced apart from the fin and recessed into a first portion of the STI structure. A second portion of the STI structure on a side of the fin opposite the dielectric anchor has a trench therein. A dielectric gate plug is on the dielectric anchor.

Example embodiment 7: The integrated circuit structure of example embodiment 6, wherein the dielectric anchor has an uppermost surface below an uppermost surface of the fin.

Example embodiment 8: The integrated circuit structure of example embodiment 6 or 7, wherein the dielectric gate plug is vertically offset from the dielectric anchor.

Example embodiment 9: The integrated circuit structure of example embodiment 6, 7 or 8, wherein the gate dielectric material layer is a high-k gate dielectric layer, and wherein the gate electrode structure includes a workfunction metal layer and a conductive gate fill material.

Example embodiment 10: The integrated circuit structure of example embodiment 6, 7, 8 or 9, wherein the gate dielectric material layer is not along sides of the dielectric gate plug, and wherein the gate electrode structure is in contact with the sides of the dielectric gate plug.

Example embodiment 11: A computing device includes a board, and a component coupled to the board. The component includes an integrated circuit structure including a sub-fin in a shallow trench isolation (STI) structure. A plurality of horizontally stacked nanowires is over the sub-fin. A gate dielectric material layer is surrounding the horizontally stacked nanowires. A gate electrode structure is over the gate dielectric material layer. A dielectric anchor is laterally spaced apart from the plurality of horizontally stacked nanowires and recessed into a first portion of the STI structure. A second portion of the STI structure on a side of the plurality of horizontally stacked nanowires opposite the dielectric anchor has a trench therein. A dielectric gate plug is on the dielectric anchor.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, wherein the component is a packaged integrated circuit die.

Example embodiment 15: The computing device of example embodiment 11, 12, 13 or 14, wherein the component is selected from the group consisting of a processor, a communications chip, and a digital signal processor.

Example embodiment 16: A computing device includes a board, and a component coupled to the board. The component includes an integrated circuit structure including a fin having a portion protruding above a shallow trench isolation (STI) structure. A gate dielectric material layer is over the protruding portion of the fin. A gate electrode structure is over the gate dielectric material layer. A dielectric anchor is laterally spaced apart from the fin and recessed into a first portion of the STI structure. A second portion of the STI structure on a side of the fin opposite the dielectric anchor has a trench therein. A dielectric gate plug is on the dielectric anchor.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:
a first fin structure over a first sub-fin, the first sub-fin in an isolation structure;
a second fin structure laterally spaced apart from the first fin structure, the second fin structure over a second sub-fin, the second sub-fin in the isolation structure;
a dielectric anchor in the isolation structure, the dielectric anchor laterally between and spaced apart from the first fin structure and the second fin structure;
a gate dielectric layer over the first fin structure and over the second fin structure, and the gate dielectric layer on sides of the dielectric anchor;
a gate electrode over the gate dielectric layer, the gate electrode having a first portion over the first fin structure and having a second portion over the second fin structure, wherein the dielectric anchor is laterally between the first portion of the gate electrode and the second portion of the gate electrode; and
a gate cut plug on the top surface of the dielectric anchor, the gate cut plug between the first portion of the gate electrode and the second portion of the gate electrode, wherein the gate plug is laterally offset from the dielectric anchor along a vertical axis, and wherein the gate plug has a bottommost surface above a top surface of the dielectric anchor.

2. The integrated circuit structure of claim 1, wherein the gate dielectric layer is not along sides of the gate cut plug.

3. The integrated circuit structure of claim 1, wherein the gate cut plug is in contact with the first portion of the gate electrode and the second portion of the gate electrode.

4. The integrated circuit structure of claim 1, wherein the dielectric anchor has a top surface below a top of the first fin structure and a top of the second fin structure.

5. The integrated circuit structure of claim 1, wherein the dielectric anchor has a top surface at a same level as a top of the first fin structure and a top of the second fin structure.

6. The integrated circuit structure of claim 1, wherein the dielectric anchor has a top surface above a top of the first fin structure and a top of the second fin structure.

7. The integrated circuit structure of claim 1, wherein the gate cut plug is a single material structure.

8. The integrated circuit structure of claim 1, wherein the gate cut plug is a multilayer stack structure.

9. An integrated circuit structure, comprising:
a first fin structure over a first sub-fin, the first sub-fin having a first side laterally opposite a second side;
a second fin structure laterally spaced apart from the first fin structure, the second fin structure over a second sub-fin, the second sub-fin having a first side laterally opposite a second side;
a dielectric structure laterally between and spaced apart from the first fin structure and the second fin structure, and the dielectric structure laterally between and spaced apart from the second side of the first sub-fin structure and the first side of the second sub-fin, the dielectric structure having a first side laterally opposite a second side;
an isolation material having a first portion in contact with the first side of the first sub-fin, the isolation material having a second portion in contact with the second side of the first sub-fin, with a lower portion of the first side of the dielectric structure, with a lower portion of the second side of the dielectric structure, and with the first side of the second sub-fin, and the isolation material having a third portion in contact with the second side of the second sub-fin;
a gate dielectric layer over the first fin structure and over the second fin structure, and the gate dielectric layer on sides of the dielectric structure;
a gate electrode over the gate dielectric layer, the gate electrode having a first portion over the first fin structure and having a second portion over the second fin structure, wherein the dielectric structure is laterally between the first portion of the gate electrode and the second portion of the gate electrode; and
a gate cut plug on the top surface of the dielectric structure, the gate cut plug between the first portion of the gate electrode and the second portion of the gate electrode.

10. The integrated circuit structure of claim 9, wherein the gate dielectric layer is not along sides of the gate cut plug, and wherein the gate cut plug is in contact with the first portion of the gate electrode and the second portion of the gate electrode.

11. The integrated circuit structure of claim 9, wherein the dielectric structure has a top surface at a same level as a top of the first fin structure and a top of the second fin structure.

12. The integrated circuit structure of claim 9, wherein the gate cut plug is a single material structure.

13. The integrated circuit structure of claim 9, wherein the gate plug is laterally offset from the dielectric anchor along a vertical axis, and wherein the gate plug has a bottommost surface above a top surface of the dielectric anchor.

14. An integrated circuit structure, comprising:
a first stack of nanowires over a first sub-fin, the first sub-fin in an isolation structure;
a second stack of nanowires laterally spaced apart from the first stack of nanowires, the second stack of nanowires over a second sub-fin, the second sub-fin in the isolation structure;
a dielectric anchor in the isolation structure, the dielectric anchor laterally between and spaced apart from the first stack of nanowires and the second stack of nanowires;
a gate dielectric layer over the first stack of nanowires and over the second stack of nanowires, and the gate dielectric layer on sides of the dielectric anchor;
a gate electrode over the gate dielectric layer, the gate electrode having a first portion over the first stack of nanowires and having a second portion over the second stack of nanowires, wherein the dielectric anchor is laterally between the first portion of the gate electrode and the second portion of the gate electrode; and
a gate cut plug on the top surface of the dielectric anchor, the gate cut plug between the first portion of the gate electrode and the second portion of the gate electrode, wherein the gate plug is laterally offset from the dielectric anchor along a vertical axis, and wherein the gate plug has a bottommost surface above a top surface of the dielectric anchor.

15. The integrated circuit structure of claim 14, wherein the gate dielectric layer is not along sides of the gate cut plug.

16. The integrated circuit structure of claim 14, wherein the gate cut plug is in contact with the first portion of the gate electrode and the second portion of the gate electrode.

17. The integrated circuit structure of claim 14, wherein the dielectric anchor has a top surface below a top of the first stack of nanowires and a top of the second stack of nanowires.

18. The integrated circuit structure of claim 14, wherein the dielectric anchor has a top surface at a same level as a top of the first stack of nanowires and a top of the second stack of nanowires.

19. The integrated circuit structure of claim 14, wherein the dielectric anchor has a top surface above a top of the first stack of nanowires and a top of the second stack of nanowires.

20. The integrated circuit structure of claim 14, wherein the gate cut plug is a single material structure.

21. The integrated circuit structure of claim 14, wherein the gate cut plug is a multilayer stack structure.

22. A method of making an integrated circuit, comprising:
    forming a first fin structure over a first sub-fin, the first sub-fin in an isolation structure;
    forming a second fin structure laterally spaced apart from the first fin structure, the second fin structure over a second sub-fin, the second sub-fin in the isolation structure;
    forming a dielectric anchor in the isolation structure, the dielectric anchor laterally between and spaced apart from the first fin structure and the second fin structure;
    forming a gate dielectric layer over the first fin structure and over the second fin structure, and the gate dielectric layer on sides of the dielectric anchor;
    forming a gate electrode over the gate dielectric layer;
    etching a gate cut in the gate electrode to provide a first portion and a second portion of the gate electrode, the first portion over the first fin structure and the second portion over the second fin structure, wherein the dielectric anchor is laterally between the first portion of the gate electrode and the second portion of the gate electrode; and
    forming a gate cut plug on the top surface of the dielectric anchor, the gate cut plug between the first portion of the gate electrode and the second portion of the gate electrode.

23. The method of claim 22, wherein the gate dielectric layer is not along sides of the gate cut plug.

24. The method of claim 22, wherein the gate cut plug is in contact with the first portion of the gate electrode and the second portion of the gate electrode.

25. The method of claim 22, wherein the gate plug is laterally offset from the dielectric anchor along a vertical axis, and wherein the gate plug has a bottommost surface above a top surface of the dielectric anchor.

* * * * *